United States Patent [19]
Sato et al.

[11] Patent Number: 5,489,621
[45] Date of Patent: Feb. 6, 1996

[54] PROCESS FOR FORMING COLORED PARTIAL PICTURE ELEMENT AND LIGHT-SHIELDING LIGHT-SENSITIVE RESIN COMPOSITION USED THEREFOR

[75] Inventors: Morimasa Sato; Masayuki Iwasaki; Takekatsu Sugiyama, all of Shizuoka, Japan

[73] Assignee: Fuji Photo Film Co., Ltd., Kanagawa, Japan

[21] Appl. No.: 241,571

[22] Filed: May 12, 1994

[30] Foreign Application Priority Data

| | | | |
|---|---|---|---|
| May 12, 1993 | [JP] | Japan | 5-110487 |
| May 12, 1993 | [JP] | Japan | 5-110488 |
| May 13, 1993 | [JP] | Japan | 5-111543 |
| Dec. 14, 1993 | [JP] | Japan | 5-313558 |

[51] Int. Cl.⁶ ............... G03C 1/725; G03C 1/73; G03C 5/00
[52] U.S. Cl. ............... 572/75; 522/81; 430/281.1; 430/292; 430/293; 430/294
[58] Field of Search ............... 522/75, 81; 430/281, 430/292, 293, 294

[56] References Cited

U.S. PATENT DOCUMENTS

| | | | |
|---|---|---|---|
| 3,549,367 | 12/1970 | Chang et al. | 96/35.1 |
| 3,820,993 | 6/1974 | Lewis et al. | 522/75 |
| 4,139,391 | 2/1979 | Ikeda et al. | 96/115 R |
| 4,210,713 | 7/1980 | Sumiyoshi et al. | 522/81 |
| 4,212,976 | 7/1980 | Shen et al. | 546/115 |
| 4,239,850 | 12/1980 | Kira et al. | 430/281 |
| 4,501,689 | 2/1985 | Yanagawa | 522/81 |
| 4,533,975 | 8/1985 | Bill | 522/81 |
| 4,544,625 | 10/1985 | Ishimaru et al. | 522/81 |
| 4,856,670 | 8/1989 | Hang et al. | 522/81 |
| 5,284,736 | 2/1994 | Kushi et al. | 522/81 |
| 5,362,603 | 11/1994 | Katol et al. | 430/281 |
| 5,436,279 | 7/1995 | Grundke et al. | 522/81 |

FOREIGN PATENT DOCUMENTS

| | | | |
|---|---|---|---|
| 0088050 | 9/1983 | European Pat. Off. | 522/81 |
| 54-71132 | 6/1979 | Japan | 522/81 |
| 2-8203 | 1/1990 | Japan | 522/81 |

*Primary Examiner*—Charles L. Bowers, Jr.
*Assistant Examiner*—J. Pasterczyk
*Attorney, Agent, or Firm*—Sughrue, Mion, Zinn, Macpeak & Seas

[57] ABSTRACT

A light-shielding light-sensitive resin composition containing at least (1) an alkali soluble binder, (2) a photopolymerization initiator, (3) an addition-polymerizable monomer having an ethylenically unsaturated double bond, and (4) at least two coloring agents, wherein the light-shielding light-sensitive resin composition is characterized in that said resin composition is equivalent or close to a black color in terms of hue and, when formed into a light-shielding light-sensitive resin layer having a layer thickness of 1 to 3 micrometers, has a transmittability in a visible ray region of 2 or less and a ratio of the transmittability in the visible region to the transmittability in the UV region of 1:1 to 20:1.

6 Claims, No Drawings

PROCESS FOR FORMING COLORED PARTIAL PICTURE ELEMENT AND LIGHT-SHIELDING LIGHT-SENSITIVE RESIN COMPOSITION USED THEREFOR

FIELD OF THE INVENTION

The present invention relates to a process for forming a colored partial picture element which is useful for manufacturing a color filter for a color television, a color display device, and a color image pick-up device which use a liquid crystal and for correcting a deficiency which is generated in the manufacturing thereof, and to a light-shielding light-sensitive resin composition used therefor.

BACKGROUND OF THE INVENTION

In a color filter used for a liquid crystal display of a full color, a pattern picture element having a light-shielding property is usually provided between the respective picture elements of R, G and B for the purposes of preventing light leakage and improving contrast.

This pattern picture element having the light-shielding property is formed by using a metal film of chromium and a material obtained by dispersing a black dye in a light-sensitive resin composition. In the case of the metal film of chromium, the metal film is deposited on a full face of a glass substrate by means of deposition, and then a resist is coated, followed by carrying out patterning and etching to subject the metal film to patterning. This method has very complicated processes and a bad yield and is costly. Meanwhile, there has been known a forming process for a pattern picture element having a light-shielding property which is provided by a light-sensitive black resin obtained by combining a light-sensitive resin composition with carbon. In this case, a film thickness of several μm is required to obtain a light-shielding property to some extent, and since the present state of the art is that in preparing a color filter, the pattern picture element having the light-shielding property usually has overlapping with the R, G and B picture elements to some extent from a viewpoint of a problem on an alignment error, an unevenness is generated on the surface of the color filter. Accordingly, the actual situation is that to obtain a good flatness, a flattening layer is further provided thereon or surface grinding is carried out.

JP-A-3-209203 (the term "JP-A" as used herein means an unexamined Japanese patent application) and JP-A-4-69602 describe the processes in which a black color light-sensitive resin composition layer is coated on a full face after forming the R, G and B picture elements and exposing is carried out from the back face to form the pattern picture elements having a light-shielding property between the R, G and B picture elements. However, it is very difficult in these processes to coat the black color light-sensitive resin composition layer all over the face between the respective R, G and B picture elements in the same thickness as those of the R, G and B picture elements, and the preparation of a liquid crystal panel using a color filter prepared by these processes has the problem that a cell gap produced is not uniform to generate a display unevenness.

Further, there are many chances to see still pictures on a device using a liquid crystal display element and accordingly, a deficiency on the picture elements of the respective colors constituting a color filter is desirably zero.

However, many difficulties are accompanied in manufacturing a lot of the color filters which are completely free from a deficiency of a picture element attributable to a fine dust present and insufficient washing of a substrate in a washing process.

Thus, there has been required a correcting method for a color filter having a small number of lacked picture elements to further improve yield.

In a conventional deficiency correcting method in which a colored light-sensitive resin composition coating solution is applied to a deficiency part and exposing is carried out through a glass substrate, it has been very difficult, due to limits of a coating technique, to form a corrected picture element having a good flatness at the deficient part. Further, in the case where the deficiencies of plural colors are involved, the processes for coating a colored light-sensitive resin composition solution, exposing and developing must be repeated several times, which has generated another deficiency in some cases as well as requiring enormous labor.

Further, a colored light-sensitive resin composition layer is formed as well on a picture element having a deficiency, and if the colored light-sensitive resin composition layer provided on the picture element having the deficiency has a large transmittance in a light-sensitive wavelength region, the colored light-sensitive resin composition layer formed on the picture element is cured as well. Thus a serious non-removable defect resulted and a hue was changed.

SUMMARY OF THE INVENTION

A first object of the present invention is to provide a process for forming a colored partial picture element for readily forming a pattern picture element having a high light-shielding property with a good flatness and accuracy over a wide area between the multicolor patterns which are formed by picture elements each having one of the three primary colors of light provided on a transparent substrate.

A second object of the present invention is to provide a light-shielding light-sensitive resin composition which meets the above object.

A third object of the present invention is to provide a method for readily correcting a small number of deficiencies present at a part of the picture elements described above each having one of the three primary colors of light, which are provided on a transparent substrate.

The objects of the present invention have been achieved by a process for forming a colored partial picture element, comprising a step of forming a colored light-sensitive resin composition layer on a transparent substrate by transfer so as to cover at least a part of multicolor patterns formed by picture elements each having one of the three primary colors of light which are provided on the transparent substrate, a step of irradiating the above colored light-sensitive resin composition layer with an active ray through the transparent substrate to cure it, and a step of developing the above colored light-sensitive resin composition layer to form a colored partial picture element at a part where at least a part of the above multicolor patterns is not present, wherein the picture element of at least one color of the above picture elements having the three primary colors of light contains at least one compound selected from the compounds represented by the following formulas (I) to (III). The colored partial picture element includes not only the picture elements having the three primary colors of light but also pictures having a light-shielding property.

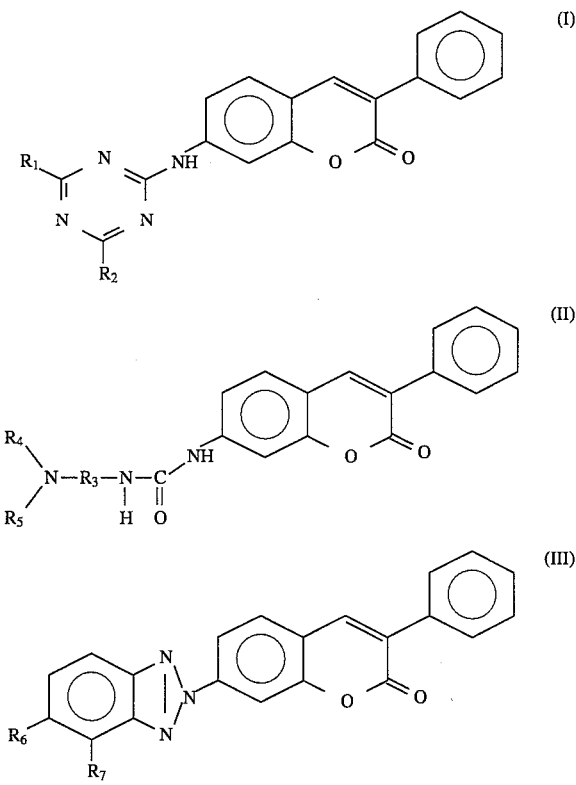

wherein:

R₁ represents a hydrogen atom, an amino group, a dialkylamino group, a monoalkylamino group, an N-substituted aminoalkyl group, a halogen atom, an alkoxy group, an amino group substituted with at least one hydroxyalkyl group, or a group represented by the following formula (IV)

wherein:

R₂ represents a hydrogen atom, a halogen atom, an amino group, an alkyl group, an aralkyl group, an aryl group, an aralkyloxy group, an alkoxy group, an aryloxy group, a dialkylamino group, a monoalkylamino group, an N-substituted aminoalkyl group, an amino group substituted with at least one hydroxyalkyl group, or a group represented by the above formula (IV); provided that R₁ and R₂ may be the same or different;

R₃ represents an alkyl group having 1 to 7, preferably 1 to 4 carbon atoms;

R₄ and R₅, which may be the same or different, each represents a hydrogen atom or an alkyl group having 1 to 7, preferably 1 to 4 carbon atoms;

R₆ and R₇, which may be the same or different, each represents a hydrogen atom, an alkyl group having 1 to 7, preferably 1 to 4 carbon atoms, or an alkoxy group having 1 to 4 carbon atoms;

R₈ represents an alkylene group which may have a substituent;

R₉ represents a hydrogen atom, an alkyl group, an aralkyl group, an aryl group, an alkoxyalkyl group, an aralkyloxyalkyl group, an aryloxyalkyl group, or a group represented by HO—R₈—; and R₈ and R₉ may contain a nitrogen atom to form a 5- or 6-membered hetrocyclic ring.

DETAILED DESCRIPTION OF THE INVENTION

The present invention will be explained below in detail.

All the conventional processes including a dyeing process, a printing process, a pigment dispersing process, an electrodeposition process, and a transfer process can be used as a process for forming a multicolor pattern consisting of the picture elements each having one of R, G and B which are the three primary colors of light on a transparent substrate (hereinafter referred to simply as a multicolor pattern).

An outline of the colored partial picture element-forming process according to the present invention is as follows.

First, a colored light-sensitive resin composition layer is formed on a transparent substrate by transfer so as to cover at least a part of the above multicolor patterns. Next, an active ray irradiates it, for example, through the above transparent substrate. The colored light-sensitive resin composition layer corresponding to a part where the multicolor pattern is not present, is cured by this irradiation, and therefore development of the colored light-sensitive resin composition layer allows a colored partial picture element to be formed only at the part where the multicolor pattern is not present.

In the process described above, curing only of the colored light-sensitive resin composition layer corresponding to the part where the multicolor pattern is not substantially present (i.e., a part between the R, G and B picture elements or a deficient part in these picture elements and a light-shielding element; hereinafter referred to simply as "a transparent part") requires to allow the light transmittance of the respective picture elements of red, green, blue and a black matrix each formed on the substrate to become 2% or less in the light-sensitive wavelength region for the colored light-sensitive resin composition layer used for forming a colored partial picture element. In this case, the colored light-sensitive resin composition layer which is present on the picture element, is not substantially cured while the colored light-sensitive resin composition layer which is present on the transparent part is sufficiently cured, and therefore only the former can readily be removed by a subsequent processing, for example, a development processing.

The light transmittance exceeding 2% partially cures as well the colored light-sensitive resin composition layer which is present on the picture element in some cases and therefore makes it difficult to remove the layer on the picture element.

Allowing the light transmittances of the respective picture elements to become 2% or less as described above includes, for example, the following processes.

One of the processes is a process in which a light absorber is added in advance to the compositions constituting the respective picture elements. The conventional compounds can be used as the light absorber. Specifically, there can be listed a benzophenone derivative (e.g., Michler's ketone), a merocyanine compound, 2-benzoylmethylene-3-methyl-β-naphthothiazoline, a metal oxide (e.g., titanium oxide, zinc oxide), a benzotriazole compound, and a coumarin compound. Of them, those having a good light absorptivity and keeping a light absorptive performance of 25% or more even after a heat treatment at 200° C. or higher are preferred. Specifically, they include titanium oxide, zinc oxide, the benzotriazole compound and the coumarin compound. The coumarin compound is particularly preferred from a viewpoint of heat resistance and light absorptivity. Further, the coumarin compound is preferred since it does not prevent photopolymerization in the case where a multicolor pattern is formed with a photopolymerizable composition.

The above heat treatment at 200° C. is carried out in order to further cure a pattern picture element according to necessity in preparing a color filter.

Preferred as coumarin is at least one compound selected from the compounds represented by formulas (I) to (III) described above.

Specific examples of the compounds represented by formulas (I) to (III) described above are shown below but the compounds which can be used in the present invention are not limited thereto.

7-{{4-chloro-6-(diethylamino)-s-triazine-2-yl}amino}-3-phenylcoumarin,

7-{{4-methoxy-6-(diethylamino)-s-triazine-2-yl}amino}-3-phenylcoumarin,

7-{{4-methoxy-6-(diethylaminopropylamino)-s-triazine-2-yl}amino}-3-phenylcoumarin, N-(δ-(diethylaminopropyl)-N'-{3-phenylcoumarinyl-(7)}urea, 3-phenyl-7-(4'-methyl-5'-n-butoxybenzotriazole-2)coumarin, and the compounds represented by Compound 1 to Compound 11.

Among them, preferred are 7-{{4-chloro-6-(diethylamino)-s-triazine-2-yl} amino}-3-phenylcoumarin and the compounds represented by Compound 1 to Compound 11, and further, 7-{{4-chloro-6-(diethylamino)-s-triazine-2-yl}amino}-3-phenylcoumarin, Compound 1 and Compound 5 are particularly preferred since a light absorptive performance exceeds 50% even after carrying out a heat treatment at 200° C. or higher.

In the present invention, there are used as a transfer material, a transfer process and an image-forming process such as a developing process each used in the process for forming a light-shielding light-sensitive resin composition layer on a full face of a transparent substrate by transfer so that a multicolor pattern is covered, a transfer material having a separation layer having a small adhesive strength to a temporary support and a light-sensitive resin composition layer, and an image-forming process each disclosed in JP-A-4-208940, a light-sensitive transfer material having a thermoplastic resin layer, an intermediate layer and a light-sensitive resin composition layer on a temporary support and having the smallest adhesive strength between the temporary support and the thermoplastic resin layer, and an image-forming process each disclosed in JP-A-5-173320, a transfer material which has a thermoplastic resin layer, a separating layer and a light-sensitive resin composition layer and which has the smallest adhesive strength between the thermoplastic resin layer and the separating layer, and an image-forming process each disclosed in JP-A-5-72724, and a light-sensitive transfer material which has a thermoplastic resin layer, an intermediate layer and a light-sensitive resin composition layer on a temporary support and which has the smallest adhesive strength between the temporary support and the thermoplastic resin layer, and an image-forming process each disclosed in JP-A-5-80503.

Those described in JP-A-4-208940, JP-A-5-2107, JP-A-5-72724, and JP-A-5-173302 can be used as a colored light-sensitive transfer material having the other hue used in the present invention. Since in any case, preferred is a colored light-sensitive transfer material characterized in that an alkali soluble thermoplastic resin layer, a separating layer and colored light-sensitive resin composition layer are provided in this order on a temporary support and that an adhesive strength between the above thermoplastic resin layer and the above temporary support is the smallest; a detailed explanation follows below.

The temporary support used for the above light-sensitive transfer material should have a satisfactory separating property from the thermoplastic resin layer, chemical and thermal stability and to be composed of a flexible material. Specifically, preferred are a thin sheet of Teflon, polyethylene terephthalate, polycarbonate, polyethylene, and polypropylene, and the laminated material thereof. The thickness of the temporary support is suitably 5 μm to 300 μm, preferably 20 μm to 150 μm.

An organic high molecular material used for the thermoplastic resin layer is preferably selected from the organic high molecular materials having a softening point of about 80° C. or lower as measured by the Vicat method (specifically, a polymer softening point measuring method by ASTMD 1235 in an American Material Testing Law). The reason is that transfer can be carried out in the state that in transferring a transfer sheet on a substrate having an unevenness by heat and pressure, use of a polymer having a low softening point allows the unevenness on a foundation to be completely absorbed and a bubble does not remain at all. In the case where a polymer having a high softening point is used, the transfer must be carried out at a high temperature and it is substantially disadvantageous in terms of an operation. From this point of view, the organic high molecular material used for the thermoplastic resin layer has the softening point of about 80° C. or lower as measured by the Vicat method, preferably 60° C. or lower, and particularly preferably 50° C. or lower. That having the softening point of 80 ° C. or lower is preferably at least one selected from a saponified product of a copolymer of ethylene and acrylate, a saponified product of a copolymer of styrene and (metha)acrylate, a saponified product of a copolymer of vinyltoluene and (metha)acrylate, poly(metha)acrylate, and a saponified product of a (metha)acrylate copolymer of butyl (metha)acrylate and vinyl acetate. Further, of the high polymers having the softening point of about 80° C. or lower described in "Plastic Performance Manual" (edited by Japan Plastics Industry Federation and All Japan Plastics Molding Industry Association, published by Kogyo Chosakai on Oct. 25, 1968), those which are soluble in an alkaline aqueous solution can be used. Further, the conventional high polymer binders used for an alkali soluble photopolymerizable resin can be enumerated as an example of the resin which is soluble in an alkaline aqueous solution. It includes a copolymer of (metha)acrylic acid and alkyl acrylate (an alkyl group includes methyl, ethyl and butyl), poly(metha)acrylic acid, a copolymer of styrene and an unsaturated dibasic acid anhydride such as maleic acid, a reaction product of the above polymers and alcohols, and a reaction product of cellulose with a polybasic acid anhydride. Of the polymers described above, those particularly preferably used as the binder in the present invention are a styrene/maleic acid anhydride copolymer, a methyl methacrylate/methacrylicacid/2-ethylhexylmethacrylate/benzyl methacrylate quaternary copolymer described in JP-A-60-258539, a styrene/mono-n-butyl maleate copolymer described in JP-B-55-38961 (the term "JP-B" as used herein means an examined Japanese patent publication), a quaternary copolymer of styrene/methylmethacrylate/ethylmethacrylate/methacrylicacid described in JP-B-54-25957, a benzyl methacrylate/methacrylic acid copolymer described in JP-A-52-99810, a ternary copolymer of acrylonitrile/2-ethylhexyl methacrylate/methacrylic acid described in JP-B-58-12577, and a ternary copolymer of methyl methacrylate/ethyl methacrylate/acrylic acid and a styrene/maleic anhydride copolymer which is partially esterified with isopropanol, each described in JP-B-55-6210.

Also in an organic high polymer material having a softening point of about 80° C. or higher, it is possible as well to lower a substantial softening point to 80° C. or lower by adding various plasticizers having a compatibility with the above high polymer material to the high polymer material. Further, to adjust an adhesive strength to a temporary support, various polymers, a supercooling material, an adhesion improver, a surface active agent, and a releasing agent can be added to these organic high polymer materials in a range that a substantial softening point does not exceed 80° C.

Examples of preferred plasticizers include polypropylene glycol, polyethylene glycol, dioctyl phthalate, diheptyl phthalate, dibutyl phthalate, tricresyl phosphate, cresyl diphenyl phosphate, and biphenyl diphenyl phosphate.

The thermoplastic resin layer has preferably a thickness of 6 μm or more. The reason is that the thickness of the thermoplastic resin layer of 5 μm or less makes it impossible to completely absorb unevenness of 1 μm or less on a foundation.

An upper limit thereof is about 100 μm or less, preferably about 50 μm or less.

The thermoplastic resin is forced out to the surroundings during transfer in some cases according to a transfer condition of a light-sensitive transfer material to stain a permanent support.

Of the thermoplastic resins described above, those which are dissolved in an alkaline aqueous solution are preferred in order to prevent this stain. Those which are dissolved in the alkaline aqueous solution can readily be removed by an after-treatment.

In the present invention, the alkaline aqueous solution means a diluted aqueous solution of an alkaline material and further includes those containing a small amount of an organic solvent which is miscible with water.

Suitable examples of alkaline materials include alkaline metal hydroxides (for example, sodium hydroxide and potassium hydroxide), alkaline metal carbonates (for example, sodium carbonate and potassium carbonate), alkaline metal bicarbonates (for example, sodium bicarbonate and potassium bicarbonate), alkaline metal silicates (for example, sodium silicate and potassium silicate), alkaline metal metasilicates (for example, sodium metasilicate and potassium metasilicate), triethanolamine, diethanolamine, monoethanolamine, morpholine, tetralkylammonium hydroxides (for example, tetramethylammonium hydroxide), or trisodium phosphate. The concentration of the alkaline material is preferably 0.01 weight % to 30 weight % and pH is preferably 8 to 14.

Suitable organic solvents miscible with water include methanol, ethanol, 2-propanol, 1-propanol, butanol, diacetonealcohol, ethylene glycol monomethyl ether, ethylene glycol monoethyl ether, ethylene glycol mono-n-buthyl ether, benzyl alcohol, acetone, methyl ethyl ketone, cyclohexanone, ε-caprolactone, δ-butylolactone, dimethylformamide, dimethylacetamide, hexamethylphosphoramide, ethyl lactate, methyl lactate, ε-caprolactam, and N-methylpyrrolidone. A concentration of the organic solvent which is miscible with water is 0.1 weight % to 30 weight %.

Further, a conventional surface active agent can be added. The concentration of the surface active agent is preferably 0.01 weight % to 10 weight %.

The separating layer may include those which are dispersed or dissolved in water or an alkaline aqueous solution and show a low oxygen permeability, and a conventional one can be used, for example, the polyvinyl ether/maleic anhydride copolymers described in JP-A-46-2121 and JP-B-56-40824, a water soluble salt of carboxyalkyl cellulose, water soluble cellulose ethers, a water soluble salt of carboxyalkyl starch, poly(vinyl alcohol), poly(vinyl pyrrolidone), various polyacrylamides, various water soluble polyamides, a water soluble salt of poly(acrylic acid), gelatin, an ethylene oxide polymer, a water soluble salt of the group consisting of various starches and the analogues thereof, a styrene/maleic acid copolymer, a maleate resin, and the combination of two or more kinds thereof.

Particularly preferred is the combination of poly(vinyl alcohol) and poly(vinyl pyrrolidone). Poly(vinyl alcohol) has preferably a saponification rate of 80% or more, and the content of poly(vinyl pyrrolidone) is preferably 1 weight % to 75 weight %, more preferably 1 weight % to 60 weight %, and further preferably 10 weight % to 50 weight %. The content less than 1 weight % cannot provide sufficient adhesion to a light-sensitive resin composition layer, and that exceeding 75 weight % lowers oxygen shielding performance.

The thickness of the separating layer is very small and about 0.1 to 5 μm, particularly 0.5 to 2 μm. The thickness less than about 0.1 μm increases oxygen permeability too much, and that exceeding about 5 μm results in too much time in developing or removing the separating layer.

The colored light-sensitive resin composition layer is preferably softened or becomes tacky at least at a temperature of 150° C. or lower and is preferably thermoplastic. A great part of a layer using a conventional photopolymerizable composition has this nature, and a part of the conventional layers can be further improved by adding a thermoplastic binder or a compatible plasticizer.

In the present invention, for example, all the light-sensitive resin compositions described in JP-A-3-282404 can be used as a material for the light-sensitive resin composition layer. Specifically, there are enumerated a light-sensitive resin composition layer consisting of a negative type diazo resin and a binder, a light-sensitive resin composition layer consisting of a photopolymerizable composition, an azide compound and a binder, and a cinnamic acid type light-sensitive resin composition.

Among them, particularly preferred is the photopolymerizable resin. The photopolymerizable resin contains a photopolymerization initiator, a photopolymerizable monomer and a binder as the basic constitutional elements.

Those capable of being developed by an alkali aqueous solution and those capable of being developed by an organic solvent are known as the light-sensitive resin composition. Those capable of being developed by an alkali aqueous solution are preferred from a viewpoint of preventing environmental pollution and securing labor safety.

The alkali soluble binder used in the present invention includes a polymer having a carboxylic acid group on the side chain, for example, methacrylic acid copolymers, acrylic acid copolymers, itaconic acid copolymers, crotonic acid copolymers, maleic acid copolymers, and partially esterified maleic acid copolymers each described in JP-A-59-44615, JP-B-54-34327 (the term "JP-B" as used herein means an examined Japanese patent publication), JP-B-58-12577, and JP-B-54-25957, and JP-A-59-53836 and 59-71048. Further, a cellulose derivative having a carboxylic acid group on the side chain is enumerated. In addition thereto, those obtained by adding a cyclic acid anhydride to a polymer having a hydroxyl group are useful as well. There can be particularly preferably enumerated the copolymers of benzyl (metha)acrylate and (metha)acrylic acid and the four-component copolymer of benzyl (metha)acrylate, (metha)acrylic acid and the other monomers, described in U.S. Pat. No. 4,139,391. Those enumerated above are the water insoluble binders, and poly(vinyl pyrrolidone), polyethylene oxide and poly(vinyl alcohol) can be enumerated as a water soluble binder.

In addition to the above, to improve various performances, for example, the strength of a cured film, an alkali insoluble polymer can be added to such an extent that a developing performance is not adversely affected. Alcohol soluble nylon or an epoxy resin can be enumerated as these polymers.

A solid matter content of the binder in the light-shielding light-sensitive resin composition is 10 to 95 weight %, more preferably 20 to 90 weight %. Below 10 weight %, tackiness of a light-sensitive resin layer is increased too much. Above 95 weight %, deterioration occurs us to the strength and photosensitivity of an image formed.

Examples of the photopolymerization initiators include the vic-polyketoaldonyl compounds disclosed in U.S. Pat. No. 2,367,660, the acyloin ether compounds described in U.S. Pat. No. 2,448,828, the aromatic acyloin compounds substituted with α-hydrocarbon, described in U.S. Pat. No. 2,722,512, the polynuclear quinone compounds described in U.S. Pat. Nos. 3,046,127 and 2,951,758, the combinations of triarylimidazole dimers and p-aminoketones, described in U.S. Pat. No. 3,549,367, the benzothioazole compounds and the trihalomethyl-s-triazine compounds each described in JP-B-51-48516, the trihalomethyl-s-triazine compounds described in U.S. Pat. No. 4,239,850, and the trihalomethyloxadiazole compounds described in U.S. Pat. No. 4,212,976. Particularly preferred are trihalomethyl-s-triazine, trihalomethyloxadiazole and triarylimidazole dimer.

A solid matter content of the photopolymerization initiator in a photopolymerizable composition solid matter is 0.5 to 20 weight %, more preferably 1 to 15 weight %. That less than 0.5 weight % lowers photosensitivity and the strength of an image, and that exceeding 20 weight % does not allow a good effect to the performance to be observed.

The addition-polymerizable monomer used in the present invention having an ethylenically unsaturated double bond includes a compound having at least one addition-polymerizable ethylenically saturated group in a molecule and having a boiling point of 100° C. or higher at ordinary pressure. There can be enumerated, for example, monofunctional acrylate or monofunctional methacrylate such as polyethylene glycol mono(metha)acrylate, polypropylene glycol mono(metha)acrylate, and phenoxyethyl (metha)acrylate, and polyfunctional acrylate or polyfunctional methacrylate such as polyethylene glycol di(metha)acrylate, polypropylene glycol di(metha)acrylate, trimethylolethane triacrylate, trimethylolpropane triacrylate, trimethylolpropane diacrylate, neopentyl glycol di(metha) acrylate, pentaerythritol tetra (metha) acrylate, pentaerythritol tri(metha) acrylate, dipentaerythritol hexa(metha)acrylate, dipentaerythritol penta(metha)acrylate, hexanediol di(metha)acrylate, trimethylolpropane tri(acryloyloxypropyl)ether, tri(acryloyloxyethyl)isocyanurate, tri(acryloyloxyethyl)cyanurate, glycerin tri(metha)acrylate, and those obtained by subjecting polyhydric alcohol such as trimethylolpropane and glycerin to an addition reaction with ethylene oxide and propylene oxide and then to (metha)acrylation; urethane acrylates described in JP-B-48-41708 and 50-6034, and JP-A-51-37193; polyester acrylates described in JP-A-48-64183, and JP-B-49-43191 and 52-30490; and polyfunctional acrylate or methacrylate such as epoxy acrylates which are the reaction products of epoxy resins and (metha)acrylic acid. More preferred are trimethylolpropane tri(metha)acrylate, pentaerythritol tetra(metha)acrylate, dipentaerythritol hexa(metha)acrylate, and dipentaerythritol penta(metha)acrylate.

A solid matter content of the addition-polymerizable monomer having an ethylenically unsaturated double bond in the light-shielding light-sensitive resin composition solid matters is 5 to 50 weight %, more preferably 10 to 40 weight %. That less than 0.5 weight % lowers the photosensitivity and the strength of an image, and that exceeding 50 weight % unfavorably makes tackiness of a light-sensitive layer excessive.

A coloring material such as a pigment or a dye is added to the above light-sensitive resin composition layer. All the coloring materials are substantially evenly dispersed in the light-sensitive resin composition layer and should have a particle size of 5 μm or less, preferably 1 μm or less. In preparing a color filter, the coloring material having the particle size of 0.5 μm or less is particularly preferred.

Examples of pigments or dyes which are suitable for forming a blue, green or red colored picture element are as follows: Victoria Pure Blue BO (C. I. 42595), Auramine (C. I. 41000), Fat Black HB (C. I. 26150), Monolite Yellow GT (C. I. Pigment Yellow 12), Permanent Yellow GR (C. I. Pigment Yellow 17), Permanent Yellow HR (C. I. Pigment Yellow 83), Permanent Carmine FBB (C. I. Pigment Red 146), Hostaperm Red ESB (C. I. Pigment Violet 19), Permanent Rubine FBH (C. I. Pigment Red 11), Fastel Pink B Spura (C. I. Pigment Red 81), Monastral Fast Blue (C. I. Pigment Blue 15), Monolite Fast Black B (C. I. Pigment Black 1), and carbon black. Further, there can be enumerated as a pigment suitable for forming a color filter, C. I. Pigment Red 97, C. I. Pigment Red 122, C. I. Pigment Red 149, C. I. Pigment Red 168, C. I. Pigment Red 177, C. I. Pigment Red 180, C. I. Pigment Red 192, C. I. Pigment Red 215, C. I. Pigment Green 7, C. I. Pigment Green 36, C. I. Pigment Blue 15:1, C. I. Pigment Blue 15:4, C. I. Pigment Blue 15:6, C. I. Pigment Blue 22, C. I. Pigment Blue 60, and C. I. Pigment Blue 64.

Pigments and dyes represented by carbon black may be incorporated into a light sensitive resin composition to provide a light-sensitive resin composition layer with a light-shielding property, and the light-shielding light-sensitive resin composition having the following composition, described in Japanese patent application No. 5-110487 is more preferred. That is, it includes the light-shielding light-sensitive resin composition containing at least (1) an alkali soluble binder, (2) a photopolymerization initiator, (3) an addition-polymerizable monomer having an ethylenically unsaturated double bond, and (4) at least two kinds of coloring agents, wherein the light-shielding light-sensitive resin composition is characterized by being equivalent or close to a black color in terms of hue and, when formed into a light-shielding light-sensitive resin layer having a layer thickness of 1 to 3 μm, having the transmittability in a visible ray region of 2 or less and a ratio of the transmittability in the visible region to the transmittability in a UV region of 1:1 to 20:1. Use of the above composition allows the light-shielding light-sensitive resin layer to be photocured to a depth of a film even with a low exposure and can provide a light-shielding picture element having a high optical density by a so-called self-alignment system. The materials described above can be used as the alkali soluble binder, the photopolymerization initiator, and the addition-polymerizable monomer having an ethylenically unsaturated double bond.

At least two or more kinds of the coloring agents used in the present invention include the pigments and dyes of a red color, a green color, a blue color, a yellow color, a purple color, a magenta color, and a black color. There can be enumerated as the preferred examples thereof, Carmine 6B (C.I. 12490), Phthalocyanine Green (C.I. 74260), Phthalocyanine Blue (C.I. 74160), Mitsubishi Carbon Black MA-100 Perylene Black (BASF K0084 and K0086), Cyanine Black #1201, Lionol Yellow (C.I. 21090), Lionol Yellow GRO (C.I. 21090), Symuler a Yellow 8GF (C.I. 21105), Benzidine Yellow 4T-564D (C.I. 21095), Symuler Fast Red 4015 (C.I. 12355), Lionol Red 7B4401 (C.I. 15850), Fastogen Blue TGR-L (C.I. 74160), Lionol Blue SM (C.I. 26150), Mitsubishi Carbon Black MA-100, Mitsubishi Carbon Black #40, Victoria Pure Blue (C.I. 42595), Auramine 0 (C.I. 41000), Carotene Brilliant Flayin (C.I. Basic 13), Rhodamine 6GCP (C.I. 45160), Rhodamine B (C.I. 45170), Safranine OK 70:100 (C.I. 50240), Erio Glaucine X (C.I. 42080), Fast Black HB (C.I. 26150), C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, C.I. Pigment Blue 64, C.I. Pigment Yellow 139, C.I. Pigment Yellow 83, C.I. Pigment Violet 23. In addition thereto, a metal powder, a white pigment, and a fluorescent pigment are used as well. Two or more kinds of these coloring agents are mixed to use them so that a black color is provided in terms of hue.

A combination and a mixing ratio in mixing these coloring agents are selected so that the light-shielding light-sensitive resin composition is equivalent or close to a black color in terms of hue and when a light-shielding light-sensitive resin composition layer has a film thickness of 1 to 3 μm, the transmittability in a visible ray region becomes 2 or less and a ratio of the transmittability in the visible region to a transmittability in a UV region becomes 1:1 to 20:1.

"Equivalent or close to a black color in terms of a hue" is defined so that an achromatic color point defined by a CIE color specification method in a light source (e.g., an F10 light source) used for a display unit such as a liquid crystal display panel is a black color and defined so that the values of Δx and Δy which are the differences from the values of x and y in the achromatic color point, fall in the ranges of Δx≦0.1 and Δy≦0.1, respectively. A display contrast as the liquid crystal display panel will be short with the hues other than that described above.

The transmittability of the light-shielding light-sensitive resin composition described above in a visible ray region is defined as a Y value which is one of the three stimulus values shown by the CIE color specification method and falls preferably in the range of 0.01≦y≦2. The Y value exceeding 2 raises light transmittability too much and makes the light-shielding film performance insufficient. The transmittability in a UV ray region is defined as a transmittance (%) in a light emitting peak wavelength in the range of 350 nm or more and 400 nm or less of a light source used in exposing. In the case where an extra high pressure mercury lamp is used as the light source, it is the transmittance in 365 nm. In the case where the extra high pressure mercury lamp is used as the light source, it is essential for photo-curing the light-shielding layer having a high optical density to the depth of the layer that a ratio of the transmittability in a visible ray region to the transmittability in a UV region, that is, a ratio of the Y value to a transmittance in 365 nm is 1:1 to 20:1. The ratio exceeding 20:1 prevents a light-shielding layer from being sufficiently photo-cured to the depth thereof and cannot provide the light-shielding layer having a sufficient layer thickness. This ratio less than 1:1 can provide only the layer having an insufficient light-shielding capability in the range of a practicable layer thickness.

The preferred combination of the coloring agents includes a mixture of a red pigment and a blue pigment which have a complementary color relationship to each other and a mixture of a yellow pigment and a purple pigment which have a complementary color relationship to each other and a combination obtained by further adding a black pigment to the above mixtures. The combination of a red pigment and a blue pigment each having the complementary color relationship makes it possible to obtain the light-shielding layer having the Y value of 2 or less. However, this combination increases absorption in a UV ray region to allow the ratio of the Y value to the transmittance in 365 nm to exceed 20:1 and makes it difficult to photo-cure the light-shielding layer to the depth thereof. Further, in the combination of a yellow pigment and a purple pigment each having the complementary color relationship, while the ratio of the Y value to the transmittance in 365 nm is controlled to 20:1 or less, the light-shielding layer having the Y value of 2 or less cannot be obtained without increasing layer thickness of the light-shielding layer to exceed 3 μm.

Or, in addition to the complementary color relationship of a yellow color and a purple color, further addition of a blue pigment can provide the light-shielding layer having the Y value or less and the ratio of the Y value to a transmittance in 365 nm of 20:1 or less. Also in this case, it is possible to decrease the Y value by adding a black pigment in a range where the ratio of the Y value to the transmittance in 365 nm does not exceed 20:1.

Accordingly, the combination of both first can provide the light-shielding layer having a Y value of 2 or less and the ratio of the Y value to a transmittance in 365 nm of 20:1 or less within the range of the light-shielding layer thickness of 1 to 3 μm. Further, addition of a black pigment such as carbon within a range in which the ratio of the above Y value to the transmittance in 365 nm does not exceed 20:1, lowers the Y value without changing the light-shielding layer to a large extent.

A solid matter content of the coloring agent in the light-shielding light-sensitive resin composition solid matters is preferably 1 to 50 weight %.

The light-shielding layer formed with the light-shielding light-sensitive resin composition of the present invention has preferably a thickness of 1 μm or more and 3 μm or less. The thickness of less than 1 μm increases a pigment concentration in the light-shielding layer and deteriorates a developability. That exceeding 3 μm generates the problems, such as deteriorated developability and worsened reproducibility of image formation. The thickness of the light-shielding layer can arbitrarily be set within the range described above. Particularly, in preparing a color filter, flatness of a finished color filter is desired and accordingly, the thickness thereof is preferably set at the same layer thickness as those of the other coloring layers (the respective coloring layers of red, blue and green) in this case.

In addition to the components described above, a thermal polymerization inhibitor is preferably further added. There can be enumerated as examples thereof, hydroquinone, p-methoxyphenol, di-t-butyl-p-cresol, pyrogallol, t-butyl-cathecol, benzoquinone, 4,4'-thiobis(3-methyl-6-t-butylphenol), 2,2'-methylenebis(4-methyl-6-t-butylphenol), 2-mercaptobenzimidazole, and phenothiadine.

Further, conventional additives, for example, a plasticizer, a surface active agent, and a solvent can be added to the composition of the present invention as needed.

The light-shielding light-sensitive resin composition of the present invention can be applied to a substrate by a conventional process. Specifically, it is applied by using a spinner, a whirler, a roller coater, a curtain coater, a knife coater, a wire bar coater, and an extruder and is dried to provide a light-shielding light-sensitive resin layer on the substrate. In particular, preferred is a process in which a light-shielding light-sensitive transfer material having at least the light-shielding light-sensitive resin composition layer of the present invention provided on a temporary support is used to transfer the substrate. There are used as the specific transfer material, the transfer materials described in JP-A-4-208940, JP-A-5-72724, JP-A-5-173320 and JP-A-5-80853.

The light-sensitive resin composition layer in the present invention has a thin cover sheet on the side opposite to the support in order to protect it against stain and damage in storage. The cover sheet may be made of a material which is the same as or similar to that of a temporary support and should be readily separable from the light-sensitive resin composition layer.

For example, a silicone paper, polyolefin or a polytetrafluoroethylene sheet is suitable for a cover sheet material. The cover sheet has preferably a thickness of about 5 to 100 μm. Particularly preferred is a polyethylene or polypropylene film having the thickness of 10 to 30 μm.

An alkali developing solution for the light-sensitive resin composition layer is a dilute aqueous solution of an alkaline material. Further, that containing a small amount of an organic solvent which is miscible with water is included as well. A suitable alkaline material, a suitable organic solvent which is miscible with water, the kind of a surface active agent, and the concentration are the same as those described above provided that a processing solution for a thermoplastic resin layer need not be the same as a developing solution for the light-sensitive resin composition layer and they may have different compositions.

The developing solution can be used in the form of a bath solution or a spray solution. In order to remove an uncured part of a photopolymerizable light-shielding material layer, methods such as rubbing with a rotating brush or a wet sponge and applying a supersonic wave may be combined. Usually, the temperature of the developing solution is preferably about room temperature to 40° C. It is possible to use a rinsing step after development processing.

In the light-sensitive transfer material used in the present invention, a thermoplastic resin layer solution is applied to a temporary support to provide a thermoplastic resin layer and then, a solution of a separating layer material containing a solvent which does not dissolve the thermoplastic resin layer is coated on the thermoplastic resin layer, followed by coating a light-sensitive resin composition layer using a solvent which does not dissolve the separating layer and drying to provide it.

Or, it can advantageously be produced by providing the light-sensitive resin composition layer on an another cover sheet and sticking mutually both the above sheet having the thermoplastic resin layer and the separating layer on the temporary support and another cover sheet so that the separating layer and light-sensitive resin composition layer are contacted, or by preparing a temporary support having a thermoplastic resin layer as another cover sheet and sticking together this thermoplastic resin layer and the separating layer of the sheet consisting of the light-sensitive resin composition layer and the separating layer each provided on the cover sheet.

A double layer or a multilayer sheet obtained by sticking a sheet of a thermoplastic resin and a temporary support sheet can be used in place of a temporary support on which a thermoplastic resin layer is provided by coating. The materials described above for the thermoplastic resin layer can be used as the sheet of the thermoplastic resin. In this case, a polyethylene film and a polypropylene film are particularly preferred. A process for providing the polyethylene and polypropylene film sheets on a temporary support includes a process in which an adhesive layer is provided on a temporary support by coating a solution of a poly(vinyl acetate) resin, poly(ethylene chloride), an epoxy resin, polyurethane, a natural rubber, and a synthetic rubber and drying and a polyethylene or polypropylene film is stuck thereon under pressure and heating, a process in which an adhesive comprising a mixture of an ethylene/vinyl acetate copolymer, an ethylene/acrylate copolymer, a polyamide resin, a petroleum resin, rosins, and waxes are heated and melted for coating on a temporary support and immediately thereafter, a polyethylene or polypropylene film is stuck thereon, and a process in which polyethyelene and polypropylene are melted and extruded with an extruder in a film form, followed by pressing a temporary support for laminating while in a melted condition.

When trying to peel off a temporary support after sticking the light-sensitive resin composition layer of the light-sensitive transfer material on a permanent support, a film and a human body are electrified and an unpleasant electric shock is given in some cases. Further, this electrification attracts dust from the surroundings to generate an unexposed part in a following exposing step, causing pin holes in some cases.

Accordingly, in the light-sensitive transfer material used in the present invention, to prevent electrification, preferably used is a conductive layer which is provided on at least one face of the temporary support to control the surface electric resistance thereof to $10^{13}$ Ω or less, or a conductive layer to impart conductivity to the temporary support itself to control the surface electric resistance thereof to $10^{13}$ Ω or less.

To impart conductivity to the temporary support, a conductive material may be incorporated into the temporary support. For example, a method in which the fine particles of metal oxide and an antistatic agent are kneaded is suitable. The metal oxide includes the fine particles of at least one crystalline metal oxide selected from zinc oxide, titanium oxide, tin oxide, aluminum oxide, indium oxide, silicon oxide, magnesium oxide, barium oxide, and molybdenum oxide, and/or the composite oxide thereof. Useful as the antistatic agent are, for example, an alkyl phosphate series (for example, Electrostriper A manufactured by Kao Co., Ltd. and Elenon No. 19 manufactured by Daiichi Kogyo Seiyaku Co., Ltd.) as an anionic surface active agent, a betaine series (for example, Amorgen K manufactured by Daiichi Kogyo Seiyaku Co., Ltd.) as an amphoteric surface active agent, and a polyoxyethylene fatty ester series (for example, Nissan Nonion L manufactured by Nippon Oil & Fats Co., Ltd.) and a polyoxyethylene alkyl ether series (for example, Emalgen 106, 120, 147,420, 220, 905, and 910 each manufactured by Kao Co., Ltd., and Nissan Nonion E manufactured by Nippon Oil & Fats Co., Ltd.) as a nonionic surface active agent. In addition thereto, there are used as a nonionic surface active agent, those of a polyoxyethylene alkylphenol ether series, a polyhydric alcohol fatty ester series, a polyoxyethylene sorbitan fatty ester series, and a polyoxyethylene alkylamine series.

In the case where a conductive layer is provided on a temporary support, the conductive layer can be used suitably selecting from the conventional ones. In particular, preferred is a method in which there are incorporated the fine particles of at least one crystalline metal oxide selected from ZnO, $TiO_2$, $SnO_2$, $Al_2O_3$, $In_2O_3$, $SiO_2$, MgO, BaO, and $MoO_3$, and/or the composite oxide thereof since the conductivity of these materials is not influenced by temperature. The fine particles of the crystalline metal oxide or the composite oxide thereof have preferably a volume resistivity of $10^7$ Ω×cm or less, particularly preferably $10^5$ Ω×cm or less.

The particle size thereof is preferably 0.01 to 0.7 μm, particularly preferably 0.02 to 0.5 μm.

A manufacturing process for the fine particles of the conductive crystalline metal oxide and the composite oxide thereof is described in JP-A-56-143430. To describe it briefly, it includes (1) a process in which metal oxide fine particles are prepared by calcination and then a heat treatment is carried out in the presence of a dissimilar atom which improves the conductivity, (2) a process in which a dissimilar atom is coexisted to improve the conductivity when metal oxide fine particles are prepared by calcination, and (3) a process in which in preparing metal oxide fine particles by calcination, oxygen concentration in the atmosphere is lowered to introduce an oxygen deficiency.

Examples using the dissimilar atom include Al and In to ZnO, Nb and Ta to $TiO_2$, and Sb, Nb and a halogen atom to $SnO_2$. The added amount of the dissimilar atom falls preferably in the range of 0.01 to 30 mol %, particularly preferably 0.1 to 10 mol %.

The conductive particles are preferably used in an amount of 0.05 $g/m^2$ to 20 $g/m^2$, particularly preferably 0.1 $g/m^2$ to 10 $g/m^2$.

There can be used as a binder for these conductive layers, gelatin; cellulose ester such as cellulose nitrate, cellulose triacetate, cellulose diacetate, cellulose acetate butylate, and cellulose acetate propionate; a homopolymer or copolymer containing vinylidene chloride, vinyl chloride, styrene, acrylonitrile, vinyl acetate, alkyl (an alkyl group: C1 to C4) acrylate, and vinyl pyrrolidone; soluble polyester, polycarbonate, and soluble polyamide. In dispersing the conductive particles in these binders, a dispersant such as a titan dispersant or a silane dispersant may be added. A binder crosliking agent may be added.

There can be enumerated as the titan dispersant, the titanate coupling agents described in U.S. Pat. Nos. 4,069,192 and 4,080,353, and Blen Act (trade name, manufactured by Ajinomoto Co., Ltd.). The silane dispersant may be for example, vinyl trichlorosilane, vinyl triethoxysilane, vinyl tris(β-methoxyethoxy)silane, δ-glycidoxypropyl trimethoxysilane, and δ-methacryloxypropyl trimethoxysilane, commercially available as "silane coupling agent" from Shinetsu Chemical Co., Ltd.

There can be enumerated as the binder crosslinking agent, for example, an epoxy crosslinking agent, an isocyanate crosslinking agent, and an aziridine crosslinking agent.

The preferable conductive layer in the present invention can be provided by dispersing the conductive particles in a binder to provide them on a support, or by subjecting a support to a subbing treatment and sticking the conductive particles thereon.

In the case where the conductive layer is provided on a side of a support opposite to a light-sensitive resin composition layer in the present invention, a hydrophobic polymer layer is preferably further provided on the conductive layer to improve its antiscratch property. In this case, the hydrophobic polymer layer may be coated in the form of a solution of the polymer in an organic solvent or an aqueous latex, and the coated amount thereof is preferably about 0.05 $g/m^2$ to about 1 $g/m^2$ in terms of dry weight.

Examples of hydrophobic polymers include cellulose ester (for example, nitrocellulose and cellulose acetate), a vinyl polymer containing vinyl chloride, vinylidene chloride, or vinyl acrylate, organic solvent soluble polyamide, and polyester. There may be used for this layer, a sliding agent for providing a sliding property, for example, organic carboxylic amide described in JP-A-55-79435, and a matting agent may be added So providing the hydrophobic polymer layer does not substantially affect the conductive layer in the present invention.

In the case where a subbing layer is provided, there can be used the vinylidene chloride series copolymers described in JP-A-51-135526, and U.S. Pat. Nos. 3,143,421, 3,586,508, 2,698,235, and 3,567,452, the copolymers of a diolefin such as butadiene, described in JP-A-51-114120 and U.S. Pat. No. 3,615,556, the glycidyl acrylate- or glycidyl methacrylate-containing copolymers described in JP-A-51-58469, the polyamide epichlorohydrin resins described in JP-A-48-24923, and the maleic anhydride-containing copolymers described in JP-A-50-39536.

Further, there can suitably be used the conductive layers disclosed in JP-A-56-82504, JP-A-56-143443, JP-A-57-104931, JP-A-57-118242, JP-A-58-62647, and JP-A-60-258541.

In the case where the conductive material is incorporated into a plastic raw material which is the same as or different from the temporary support film and the conductive layer is co-extruded when the temporary support film is extruded, a conductive layer with excellent adhesiveness and anti-scratch properties can readily be obtained. Accordingly, this case does not require providing the hydrophobic polymer layer and subbing layer described above and is a particularly preferred embodiment of the conductive layer in the present invention. Coating the conductive layer can be done using a conventional method such as roller coating, knife coating, gravure coating, bar coating, and curtain coating.

In the case where the conductive layer is provided on the face of the temporary support, when a thermoplastic resin layer is not provided, to increase adhesive strength between the thermoplastic resin layer and the support, the temporary support can be provided with, for example, a surface treatment such as a glow discharge treatment, a corona discharge treatment and a UV irradiation treatment, a treatment in which a phenolic material such as a cresol novolak resin and resorcin is added to the thermoplastic resin layer, a subbing treatment of a poly(vinylidene chloride) resin, a styrene butadiene rubber and gelatin to the temporary support, and further a treatment in which these treatments are combined.

The face of the thermoplastic resin layer on the temporary support need not be provided with a specific treatment, and a suitable adhesiveness and peeling property can be achieved.

To improve its sliding property or prevent an undesirable adhesion of the light-sensitive resin composition layer to the back face of the temporary support, it is useful as well to coat a conventional fine particle-containing sliding composition and a releasing agent composition containing a silicone compound on the back face of the temporary support.

The processes for a forming method of the colored picture element of the present invention are generally as follows.

First, a cover sheet of a light-sensitive transfer material is removed and a colored light-sensitive resin composition layer is stuck on a colored picture element having a deficiency which should be corrected, under pressure, preferably with heating, wherein as to the light-sensitive transfer material, a colored light-sensitive transfer material having a color by which a deficient part is to be corrected, is selected, and the size thereof may be any size as long as the deficient part is completely covered For sticking, a conventional laminator, a vacuum laminator, and a tool which can partially heat and pressure, such as, for example, an iron may be used. An autocut laminator can be used as well to further increase productivity.

Then, after the temporary support is peeled off or as the temporary support still remains, an area completely including a deficient part is exposed through a substrate having a colored picture element, wherein since light is absorbed by the respective picture elements provided on the substrate, only a colored light-sensitive layer at the deficient part is substantially sensitized and cured without using a specific mask.

Only the deficient part may be irradiated with a beam light source such as laser or exposure may be given from a colored light-sensitive resin composition layer side through a prescribed mask.

Exposing without providing a mask decreases exposure to a colored light-sensitive transfer material which is present on a picture element other than the deficient part or a black matrix by shielding with red, green, blue and the black matrix. Doing so a curing degree of the colored light-sensitive transfer material other than the deficient part to be decreased even with an exposure necessary for the deficient part to sufficiently be cured and it can be removed by a development processing.

However, since increased exposure beyond necessity gives a situation that a part which is shielded by a picture element is cured as well and therefore cannot be developed, the exposure should be controlled to a suitable range. This exposure range can be determined by a person of ordinary skill in the art but the following method is more preferably used.

In exposing through a transparent substrate (back face exposure), a light source is selected according to a light sensitivity of a light-shielding light-sensitive resin composition, and there can be used a conventional one such as a xenon lamp, a carbon arc lamp and an argon laser, wherein an optical filter may be used to selectively take out only a desired wavelength region and in this case, the optical filter having a transmittance of 2% or less at least in a wavelength of 400 nm or more in a light-sensitive wavelength region of a colored light-sensitive resin composition layer is preferred.

A forming process for the colored partial picture element of the present invention can be used as well for correcting in the case where a part of the colored picture element is deficient. For example, in a color filter which is used for a full color liquid crystal display, a pattern picture element having a light-shielding property is provided between the respective R, G and B picture elements as already described.

In the case where a part of any of these picture elements is deficient, a colored light-sensitive resin composition layer having the same hue as that of the picture element is transferred on the deficient part. Then, exposing is carried out through a transparent substrate to polymerize and cure the light-sensitive resin composition layer corresponding to the deficient part and developing can make up for the deficient part.

According to this method for making up for the deficient part, even in the case where a picture element at a corrected part has a good flatness and a deficiency of a multicolor part is present, the colored light-sensitive transfer material which is selected for every deficient part is brought into close contact with a needed part and a processing is carried out simply by one exposure and one development processing. This not only decreases labor to a large extent as compared with a process in which the steps for coating a colored light-sensitive resin composition-coating solution, exposing and developing are repeated several times, but also to a large extent reduces the risk of generating a new deficiency.

The present invention will be explained below in further detail with reference to the examples but the present invention is not be limited thereto.

EXAMPLES

Example 1

The coating solution consisting of the following composition H1 was coated on a polyethylene terephthalate temporary support with a thickness of 100 μm and dried, whereby a thermoplastic resin layer with a dry film thickness of 20 μm was provided.

| Composition H1 for the thermoplastic resin layer | |
|---|---|
| Methyl methacrylate/2-ethylhexyl acrylate/benzyl methacrylate/ methacrylic acid copolymer (copolymerization composition ratio (mole ratio) = 55/30/10/5, weight average molecular weight = 50,000) | 15.0 parts by weight |
| Polypropylene glycol diacrylate (average molecular weight = 822) | 6.5 parts by weight |
| Tetraethylene glycol dimethacrylate | 1.5 part by weight |
| p-Toluenesulfonamide | 0.5 part by weight |
| Benzophenone | 1.0 part by weight |
| Methyl ethyl ketone | 30.0 parts by weight |

Next, the coating solution consisting of the following composition B1 was coated on the above thermoplastic resin layer and dried, whereby an intermediate layer with a dry film thickness of 1.6 μm having a separating property was provided.

| Composition B1 for the intermediate layer: | |
|---|---|
| Poly(vinyl alcohol) (PVA 205 manufactured by Kuraray Co. Ltd., a saponification rate = 80%) | 130 parts by weight |
| Poly(vinyl pyrrolidone) (PVP, K-90 manufactured by GAF Corporation) | 60 part by weight |
| Fluorine-containing surface active agent (Surflon S-131 manufactured by Asahi Glass Co., Ltd.) | 10 part by weight |
| Distilled water | 3,350 part by weight |

The coating solution consisting of the following composition C1 was coated on the temporary support having the thermoplastic resin layer and intermediate layer described above and dried, whereby a light-shielding light-sensitive resin layer having a dry film thickness of 2 μm was formed.

| Composition C1: | |
|---|---|
| Benzyl methacrylate/methacrylic acid copolymer (mole ratio = 70/30, intrinsic viscosity = 0.12) | 30.00 part by weight |
| Pentaerythritol tetraacrylate | 7.40 part by weight |
| Michler's ketone | 0.04 part by weight |
| 2-(o-Chlorophenyl)-4,5-diphenyl-imidazole dimer | 0.40 part by weight |
| Carbon black | 3.80 parts by weight |
| Hydroquinone monomethyl ether | 0.01 part by weight |
| Methyl cellosolve acetate | 280.00 parts by weight |
| Methyl ethyl ketone | 140.00 parts by weight |

Further, a cover sheet of polypropylene (thickness: 12 μm) was pressed on the light-shielding light-sensitive resin layer described above to prepare a light-shielding light-sensitive transfer material. This light-shielding light-sensitive resin layer had a light-sensitive wavelength of 350 nm to 420 nm. The primary light-sensitive wavelengths obtained when an ultrahigh pressure mercury lamp was used as a light source, were 365 nm (i ray) and 405 nm (h ray), and OD (optical density) was 2.0 (as measured with a Macbeth densitometer).

Further, the coating solutions for the red (R), blue (B) and green (G) colored light-sensitive layers having the compositions shown in the following Table 1 were prepared. Michler's ketone was added to each of the coating solutions so that an i ray transmittance of an R layer became 1%.

TABLE 1

| Composition of the light-sensitive layers | | | |
|---|---|---|---|
| | Layer | | |
| | R | B | G |
| Benzyl metacrylate/metacrylic acid copolymer (mole ratio = 73/27, intrinsic viscosity = 0.12) | 60.0 | 60.0 | 60.0 |
| Pentaerythritol tetracrylate | 43.2 | 43.2 | 43.2 |
| Michler's ketone | 2.4 | 2.4 | 2.4 |
| 2-(o-Chlorophenyl)-4,5-diphenylimidazole dimer | 2.5 | 2.5 | 2.5 |
| Irgazin Red BPT (red) | 5.4 | — | — |
| Sudan Blue (blue) | — | 5.2 | — |
| Copper phthalocyanine (green) | — | — | 5.6 |
| Carbon black (black) | — | — | — |
| Methyl cellosolve acetate | 560 | 560 | 560 |
| Methyl ethyl ketone | 280 | 280 | 280 |

These coating solutions were used to form a color filter consisting of the R, G and B picture elements each having a dry film thickness of 2 μm on a glass substrate (thickness: 1.1 mm). The transmittances of the i ray and the h ray in this case were as shown in Table 2.

TABLE 2

| | Transmittance (%) | |
|---|---|---|
| | i ray | h ray |
| R layer | 1.0 | 1.0 |
| G layer | 0.5 | 0.8 |
| B layer | 0.2 | 30.0 |

The cover sheet of the light-shielding light-sensitive transfer material was peeled off, and the face of the light-shielding light-sensitive resin layer face was stuck on the face of a multicolor pattern consisting of the R, G, and B picture elements by pressing (0.8 kg/cm$^2$) and heating (130° C.) with a laminator (VP-11 manufactured by Taisei Laminator Co., Ltd.). Subsequently, the temporary support was peeled off at the interface thereof to a thermoplastic resin layer to remove the temporary support.

Next, full face exposure was carried out with an ultrahigh pressure mercury lamp through a glass substrate. In this case, since the transmittance of the h ray in the B picture element exceeded 2% as shown in Table 2, a Toshiba glass filter (UVD36c) was placed between a light source and the glass substrate. The exposure was 100 mj/cm$^2$.

Then, the development was carried out in a 1% sodium carbonate aqueous solution to remove a non-cured part, whereby the pattern picture elements having a light-shielding property were formed at the spaces of the respective R, G and B picture elements. The finished color filter did not have overlapping between the pattern picture element having the light-shielding property and the R, G and B picture elements and had good flatness. Further, substantially no residual light-shielding light-sensitive resin layer was found on the respective R, G and B picture elements.

Comparative Example 1

A color filter was prepared in the same manner as described in Example 1, except that the Toshiba glass filter (UVD36c) was not provided in exposing. In this case, the light-shielding light-sensitive resin layer remained on the B picture element, and the resulting color filter was difficult to use.

Comparative Example 2

The coating solutions for the red (R), blue (B) and green (G) colored light-sensitive layers having the compositions shown in Table 1 of Example 1 were used to form the R, G and B multicolor patterns on a glass substrate (thickness: 1.1 mm). The transmittances of the i ray and the h ray in this case were as shown in Table 3.

TABLE 3

| | Transmittance (%) | |
|---|---|---|
| | i ray | h ray |
| R layer | 4.0 | 1.0 |
| G layer | 0.5 | 0.8 |
| B layer | 0.2 | 30.0 |

A light-shielding light-sensitive resin layer was provided on the above multicolor pattern using a light-shielding transfer material in the same manner as described in Example 1, and exposing was carried out at 100 mj/cm$^2$ through a Toshiba glass filter (UVD36c). Then, the development was carried out in a 1% sodium carbonate aqueous solution to remove a non-cured part, whereby the pattern picture elements having a light-shielding property were formed at the spaces of the respective R, G and B picture elements. In this case, since the transmittance of the i ray of R exceeded 2%, a light shielding layer problematically remained on the picture element of R.

Example 2

The coating solution consisting of the following composition H1 was coated on a polyethylene terephthalate temporary support with a thickness of 100 μm and dried, whereby a thermoplastic resin layer with a dry film thickness of 20 μm was provided.

| Composition H1 for the thermoplastic resin layer: | |
|---|---|
| Methyl methacrylate/2-ethylhexyl acrylate/benzyl methacrylate/ methacrylic acid copolymer (copolymerization composition ratio (mole ratio) = 55/30/10/5, weight average molecular weight = 50,000) | 15.0 parts by weight |
| Polypropylene glycol diacrylate (average molecular weight = 822) | 6.5 parts by weight |
| Tetraethylene glycol dimethacrylate | 1.5 parts by weight |
| p-Toluenesulfonamide | 0.5 part by weight |
| Benzophenone | 1.0 part by weight |
| Methyl ethyl ketone | 30.0 parts by weight |

Next, the coating solution consisting of the following composition B1 was coated on the above thermoplastic resin layer and dried, whereby an intermediate layer with a dry film thickness of 1.6 μm was provided.

| Composition B1 for an intermediate layer: | |
| --- | --- |
| Poly(vinyl alcohol) (PVA 205 manufactured by Kuraray Co., Ltd., a saponification rate = 80%) | 130 parts by weight |
| Poly(vinyl pyrrolidone) (PVP, K-90 manufactured by GAF Corporation) | 60 parts by weight |
| Fluorine-containing surface active agent (Surflon S-131 manufactured by Asahi Glass Co., Ltd.) | 10 parts by weight |
| Distilled water | 3,350 parts by weight |

The coating solution consisting of the following composition C1 was coated on the temporary support having the thermoplastic resin layer and intermediate layer described above and dried, whereby a light-shielding light-sensitive resin layer having a dry film thickness of 2 μm was formed.

| Composition C1: | |
| --- | --- |
| Benzyl methacrylate/methacrylic acid copolymer (mole ratio = 70/30, intrinsic viscosity = 0.12) | 30.00 parts by weight |
| Pentaerythritol tetraacrylate | 7.40 parts by weight |
| Michler's ketone | 0.04 part by weight |
| 2-(o-Chlorophenyl)-4,5-diphenyl-imidazole dimer | 0.40 part by weight |
| Carbon black | 2.80 parts by weight |
| Hydroquinone monomethyl ether | 0.01 part by weight |
| Methyl cellosolve acetate | 280.00 parts by weight |
| Methyl ethyl ketone | 140.00 parts by weight |

Further, a cover sheet of polypropylene (thickness: 12 μm) was pressed on the light-shielding light-sensitive resin layer described above to prepare a light-shielding light-sensitive transfer material. The light-shielding light-sensitive resin layer had a light-sensitive wavelength of 350 nm to 420 nm. The primary light-sensitive wavelengths obtained when an ultrahigh pressure mercury lamp was used as a light source, were 365 nm (i ray) and 405 nm (h ray), and OD (optical density) was 1.5 (as measured with a Macbeth densitometer).

Next, the coating solutions for the red, green and blue colored light-sensitive layers having the compositions shown in Table 1 of Example 1 were formed, except that 7-((4-chloro-6-(diethylamino)-s-triazine-    2-yl)amino)-3-phenylcoumarin was added for all colors so that its solid matter content became 8 %.

These coating solutions were used to form an R, G and B filter on a glass substrate (thickness: 1.1 mm). In this case, a heat treatment was provided to each color at 220° C. for 20 minutes to completely cure the respective picture elements. The transmittances of the i ray and the h ray in the respective color picture elements obtained were as shown in Table 4.

TABLE 4

| | Transmittance (%) | |
| --- | --- | --- |
| | i ray | h ray |
| R layer | 0.5 | 1.0 |
| G layer | 0.5 | 0.8 |
| B layer | 0.2 | 30.0 |

The cover sheet of the light-shielding light-sensitive transfer material was peeled off, and the face of the light-shielding light-sensitive resin layer was stuck on the face of the color filter having the above R, G and B picture elements by pressing (0.8 kg/cm$^2$) and heating (130° C.) with a laminator (VP-11 manufactured by Taisei Laminator Co., Ltd.). Subsequently, the temporary support was peeled off at the interface thereof to a thermoplastic resin layer to remove the temporary support.

Next, back face exposure was carried out with an ultrahigh pressure mercury lamp from the side opposite to the color filter face. In this case, since the transmittance of the h ray in B exceeded 2% as shown in Table 4, exposing was carried out at 100 mj/cm$^2$ via a Toshiba glass filter (UVD36c) placed between the light source and the sample. Then, the development was carried out in a 1% sodium carbonate aqueous solution to remove an unnecessary part, whereby a light-shielding film was formed at the spaces of the respective R, G and B picture elements. The finished color filter did not have overlapping between the light-shielding film and the R, G and B layers had good flatness.

Example 3

A color filter was prepared in the same manner as described in Example 2, except that 7-((4-chloro-6-diethylamino)-s-triazine-    2-yl)amino)-3-phenylcoumarin was replaced with 7-((4-methoxy-6-diethylamino)-s-triazine-2-yl)amino)-3-phenylcoumarin. In this case, the transmittances of the i ray and the h ray in the respective color picture elements obtained were as shown in Table 5.

TABLE 5

| | Transmittance | |
| --- | --- | --- |
| | i ray | h ray |
| R layer | 0.5 | 1.0 |
| G layer | 0.5 | 0.8 |
| B layer | 0.2 | 30.0 |

Evaluation was carried out in the same manner as described in Example 2 and similarly good results were obtained.

According to the process (self-alignment) of the present invention, since a light-sensitive resin layer having a light-shielding property is transferred on a multicolor pattern and back face exposure can be carried out in a status that a light-shielding resin layer provided on the picture element is not substantially cured, a color filter having excellent flatness can readily be prepared.

Examples 4 to 14

The coating solution consisting of the following composition H1 was coated on a polyethylene terephthalate temporary support with a thickness of 100 μm and dried, whereby a thermoplastic resin layer with a dry film thickness of 20 μm was provided.

| Composition H1 for the thermoplastic resin layer: | |
| --- | --- |
| Methyl methacrylate/2-ethylhexyl acrylate/benzyl methacrylate/ methacrylic acid copolymer (copolymerization composition ratio (mole ratio) = 55/30/10/5, weight average molecular weight = 50,000) | 15.0 parts by weight |
| Polypropylene glycol diacrylate (average molecular weight = 822) | 6.5 parts by weight |
| Tetraethylene glycol dimethacrylate | 1.5 part by weight |
| p-Toluenesulfonamide | 0.5 part by weight |
| Benzophenone | 1.0 part by weight |
| Methyl ethyl ketone | 30.0 parts by weight |

Next, the coating solution consisting of the following composition B1 was coated on the above thermoplastic resin layer and dried, whereby an intermediate layer with a dry film thickness of 1.6 μm having a separating property was provided.

Composition B1 for the intermediate layer:

| | |
|---|---|
| Poly(vinyl alcohol) (PVA 205 manufactured by Kuraray Co., Ltd., a saponification rate = 80%) | 130 parts by weight |
| Poly(vinyl pyrrolidone) (PVP, K-90 manufactured by GAF Corporation) | 60 parts by weight |
| Fluorine-containing surface active agent (Surflon S-131 manufactured by Asahi Glass Co., Ltd.) | 10 parts by weight |
| Distilled water | 3,350 parts by weight |

The coating solution consisting of the following composition C1 was coated on the temporary support having the thermoplastic resin layer and intermediate layer described above and dried, whereby a light-shielding light-sensitive resin layer having a dry film thickness of 2 μm was formed.

Composition C1:

| | |
|---|---|
| Benzyl methacrylate/methacrylic acid copolymer (mole ratio = 70/30, intrinsic viscosity = 0.12) | 30.00 parts by weight |
| Pentaerythritol tetraacrylate | 7.40 parts by weight |
| Michler's ketone | 0.04 part by weight |
| 2-(o-Chlorophenyl)-4,5-diphenyl-imidazole dimer | 0.40 part by weight |
| Carbon black | 3.80 parts by weight |
| Hydroquinone monomethyl ether | 0.01 part by weight |
| Methyl cellosolve acetate | 280.00 parts by weight |
| Methyl ethyl ketone | 140.00 parts by weight |

Further, a cover sheet of polypropylene (thickness: 12 μm) was pressed on the light-shielding light-sensitive resin layer described above to prepare a light-shielding light-sensitive transfer material. The light-shielding light-sensitive resin layer had a light-sensitive wavelength of 350 nm to 420 nm. The primary light-sensitive wavelengths obtained when an ultrahigh pressure mercury lamp was used for a light source were 365 nm (i ray) and 405 nm (h ray), and OD was 2.0 (as measured with a Macbeth densitometer).

Further, the coating solutions for the red (R), blue (B) and green (G) colored light-sensitive layers having the compositions shown in the following Table 6 were prepared.

TABLE 6

Composition of the coating solutions for the light-sensitive layers

| | Layer | | |
|---|---|---|---|
| | R | B | G |
| Benzyl metacrylate/metacrylic acid copolymer (mole ratio = 73/27, viscosity = 0.12) | 60.0 | 60.0 | 60.0 |
| Pentaerythritol tetraacrylate | 43.2 | 43.2 | 43.2 |
| Michler's ketone | 2.4 | 2.4 | 2.4 |
| 2-(o-Chlorophenyl)-4,5-diphenylimidazole dimer | 2.5 | 2.5 | 2.5 |
| Irgazin Red BPT (red) | 5.4 | — | — |
| Sudan Blue (blue) | — | 5.2 | — |

TABLE 6-continued

Composition of the coating solutions for the light-sensitive layers

| | Layer | | |
|---|---|---|---|
| | R | B | G |
| Copper phthalocyanine (green) | — | — | 5.6 |
| Carbon black (black) | — | — | — |
| Methyl cellosolve acetate | 560 | 560 | 560 |
| Methyl ethyl ketone | 280 | 280 | 280 |

Each of Compounds 1 to 11 was added to this coating solution so that an i ray transmittance in the R lay became 0.5 % to thereby prepare the coating solutions for Examples 4 to 14.

First, the coating solutions each containing Compound 1 were used to form a color filter consisting of the R, G and B picture elements each having a dry film thickness of 2 μm on a glass substrate (thickness: 1.1 mm). The transmittances of i ray and the h ray in this case were as shown in Table 7, respectively.

TABLE 7

| | Transmittance (%) | |
|---|---|---|
| | i ray | h ray |
| R layer | 0.5 | 1.0 |
| G layer | 0.5 | 0.8 |
| B layer | 0.2 | 30 |

The cover sheet of the light-shielding light-sensitive transfer material was peeled off, and the face of the light-shielding light-sensitive resin layer was stuck on the face of a multi-color pattern consisting of the R, G and B picture elements by pressing (0.8 kg/cm$^2$) and heating (130° C.) with a laminator (VP-11 manufactured by Taisei Laminator Co., Ltd.). Subsequently, the temporary support was peeled off at the interface thereof to a thermoplastic resin layer to remove the temporary support.

Next, full face exposure was carried out with an ultrahigh pressure mercury lamp through a glass substrate. In this case, since the transmittance of the h ray in the B picture element exceeded 2% as shown in Table 7, a Toshiba glass filter (UVD36c) was placed between the light source and the glass substrate. The exposure was 100 mj/cm$^2$.

Then, development was carried out in a 1% sodium carbonate aqueous solution to remove a non-cured part, whereby the pattern picture elements having a light-shielding property were formed at the spaces of the respective R, G and B picture elements. The finished color filter did not have overlapping between the pattern picture element having the light-shielding property and the R, G and B picture elements and had good flatness. Further, no residual light-shielding light-sensitive resin layer was substantially found on the respective R, G and B picture elements.

The same procedure was repeated using the coating solutions containing Compounds 2 to 11 to obtain almost the same good results.

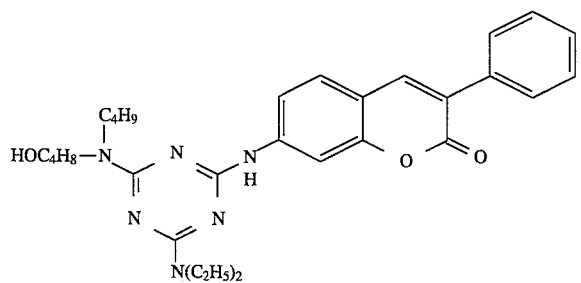
Compound 1
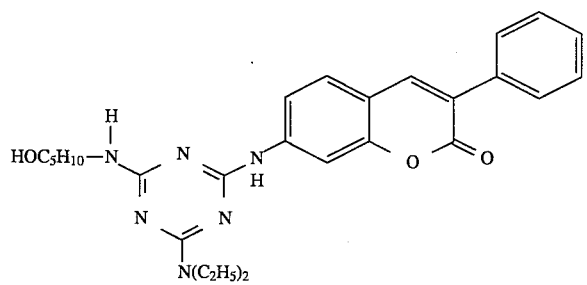
Compound 2
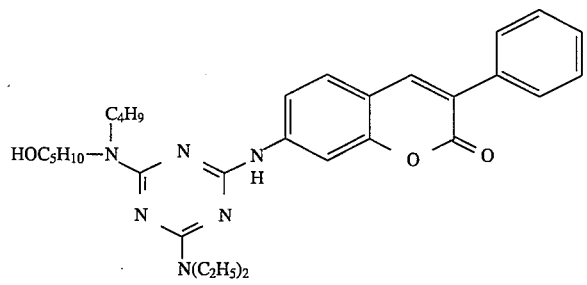
Compound 3
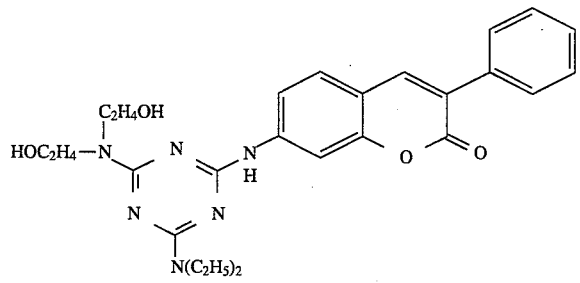
Compound 4
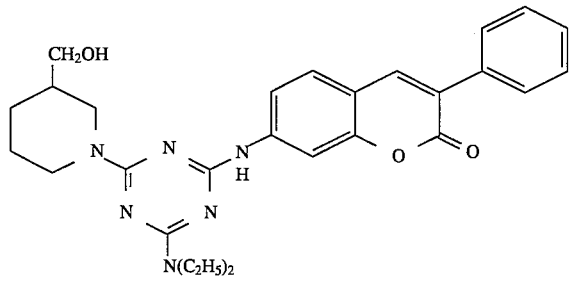
Compound 5
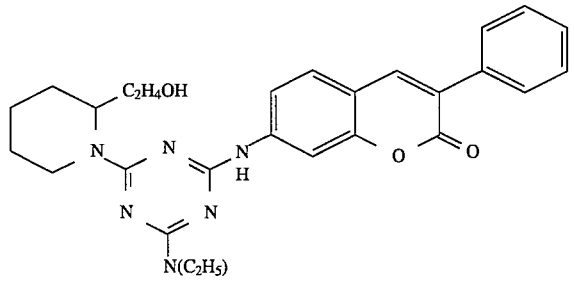
Compound 6

-continued

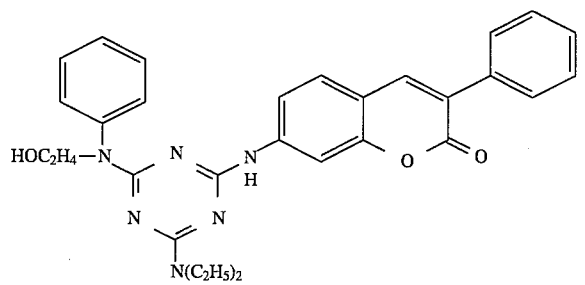

Compound 7

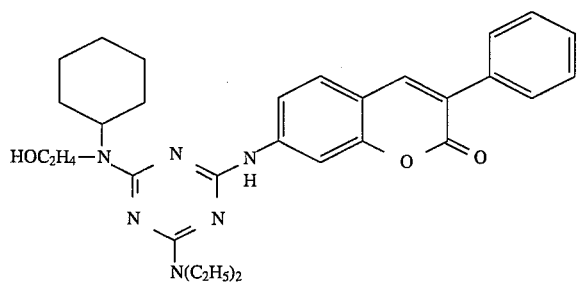

Compound 8

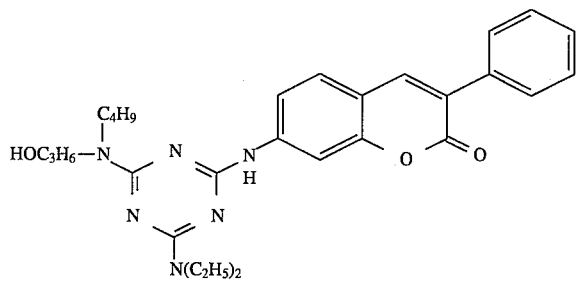

Compound 9

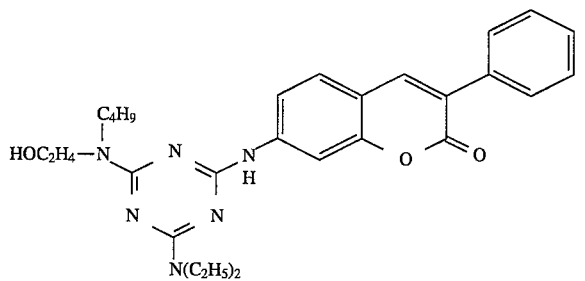

Compound 10

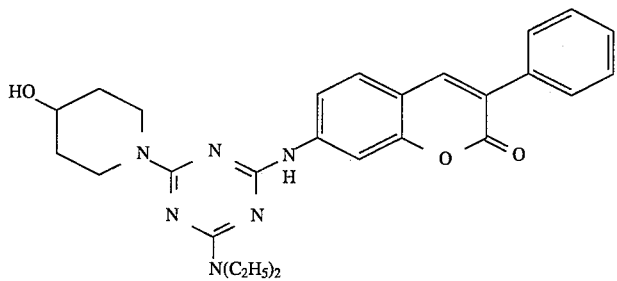

Compound 11

Comparative Example 3

A color filter was prepared in the same manner as in Example 4, except that the Toshiba glass filter (UVD36c) was not provided in exposing. In this case, the light-shielding light-sensitive resin layer remained on the B picture element, and the color filter prepared was difficult to use.

Comparative Example 4

The coating solutions for the red (R), blue (B) and green (G) colored light-sensitive layers having the compositions shown in Table 6 of Example 4 were used to form the R, G and B multicolor patterns each having a dry film thickness of 2 μm on a glass substrate (thickness: 1.1 mm). The transmittances of the i ray and the h ray in this case were as shown in Table 8.

TABLE 8

|  | Transmittance | |
| --- | --- | --- |
|  | i ray | h ray |
| R layer | 4 | 1 |
| G layer | 0.5 | 0.8 |
| B layer | 0.2 | 30.0 |

A light-shielding light-sensitive resin layer was provided on the above multicolor pattern using a light-shielding transfer material in the same manner as described in Example 4, and exposing was carried out at 100 mj/cm$^2$ through a Toshiba glass filter (UVD36c). Then, development was carried out in a 1% sodium carbonate aqueous solution to remove a non-cured part, whereby the pattern picture elements having a light-shielding property were formed at the spaces of the respective R, G and B picture elements. In this case, since the transmittance of the i ray in R exceeded 2%, a light-shielding layer remained on the picture element of R.

Example 15

The coating solution consisting of the following composition H1 was coated on a polyethylene terephthalate temporary support with a thickness of 100 μm and dried, whereby a thermoplastic resin layer with a dry film thickness of 20 μm was provided.

| Composition H1 for the thermoplastic resin layer: | |
| --- | --- |
| Methyl methacrylate/2-ethylhexyl acrylate/benzyl methacrylate/ methacrylic acid copolymer (copolymerization composition ratio (mole ratio) = 55/30/10/5, weight average molecular weight = 50,000) | 15.0 parts by weight |
| Polypropylene glycol diacrylate (average molecular weight = 822) | 6.5 parts by weight |
| Tetraethylene glycol dimethacrylate | 1.5 part by weight |
| p-Toluenesulfonamide | 0.5 part by weight |
| Benzophenone | 1.0 part by weight |
| Methyl ethyl ketone | 30.0 parts by weight |

Next, the coating solution consisting of the following composition B1 was coated on the above thermoplastic resin layer and dried, whereby an intermediate layer with a dry film thickness of 1.6 μm was provided.

| Composition B1 for an intermediate layer: | |
| --- | --- |
| Poly(vinyl alcohol) (PVA 205 manufactured by Kuraray Co., Ltd.) a saponification rate = 80%) | 130 parts by weight |
| Poly(vinyl pyrrolidone) (PVP, K-90 manufactured by GAF Corporation) | 60 parts by weight |
| Fluorine-containing surface active agent (Surflon S-131 manufactured by Asahi Glass Co., Ltd.) | 10 parts by weight |
| Distilled water | 3,350 parts by weight |

The coating solution consisting of the following composition C1 was coated on a temporary support having the thermoplastic resin layer and intermediate layer described above and dried, whereby a light-shielding light-sensitive resin layer having a dry film thickness of 2 μm was formed.

| Composition C1: | |
| --- | --- |
| Benzyl methacrylate/methacrylic acid copolymer (mole ratio = 70/30, intrinsic viscosity = 0.12) | 30.00 parts by weight |
| Pentaerythritol tetraacrylate | 7.40 parts by weight |
| Michler's ketone | 0.04 part by weight |
| 2-(o-Chlorophenyl)-4,5-diphenyl-imidazole dimer | 0.40 part by weight |
| Carbon black | 2.80 parts by weight |
| Hydroquinone monomethyl ether | 0.01 part by weight |
| Methyl cellosolve acetate | 280.00 parts by weight |
| Methyl ethyl ketone | 140.00 parts by weight |

Further, a cover sheet of polypropylene (thickness: 12 μm) was pressed on the light-shielding light-sensitive resin layer described above to thereby prepare a light-shielding light-sensitive transfer material. The light-shielding light-sensitive resin layer had a light-sensitive wavelength of 350 nm to 420 nm. The primary light-sensitive wavelengths obtained when an ultrahigh pressure mercury lamp was used for a light source, were 365 nm (i ray) and 405 nm (h ray), and OD (optical density) was 1.5 (as measured with a Macbeth densitometer).

Next, the coating solutions for the red, green and blue colored light-sensitive layers having the compositions shown in Example 4 were formed.

These coating solutions were used to form an R, G and B filter on a glass substrate (thickness: 1.1 mm). In this case, a heat treatment was effected for each color at 220° C. for 20 minutes to completely cure the respective picture elements. The transmittances of the i ray and the h ray in the respective picture elements obtained were as shown in Table 9.

TABLE 9

|  | Transmittance (%) | |
| --- | --- | --- |
|  | i ray | h ray |
| R layer | 1 | 1 |
| G layer | 0.5 | 0.8 |
| B layer | 0.2 | 30 |

The cover sheet of the light-shielding light-sensitive transfer material was peeled off, and the face of the light-shielding light-sensitive resin layer was stuck on the face of the color filter having the above R, G and B picture elements by pressing (0.8 kg/cm$^2$) and heating (130° C.) with a laminator (VP-11 manufactured by Taisei Laminator Co., Ltd.). Subsequently, the temporary support was peeled off at the interface thereof to a thermoplastic resin layer to remove the temporary support.

Next, back face exposure was carried out with an ultrahigh pressure mercury lamp from the side opposite to the color filter face. In this case, since the transmittance of the h ray in B exceeded 2% as shown in Table 9, exposing was carried out at 100 mj/cm$^2$ via a Toshiba glass filter (UVD36c) placed between the light source and the sample. Then, the development was carried out in a 1% sodium carbonate aqueous solution to remove an unnecessary part, whereby a light-shielding film was formed at the spaces of the respective R, G and B picture elements. The finished color filter did not have overlapping between the light-shielding film and the R, G and B layers had good flatness.

Example 16

The coating solution consisting of the following composition H1 was coated on a polyethylene terephthalate temporary support with a thickness of 100 μm and dried, whereby a thermoplastic resin layer with a dry film thickness of 20 μm was provided.

| Composition H1 for the thermoplastic resin layer: | |
|---|---|
| Methyl methacrylate/2-ethylhexyl acrylate/benzyl methacrylate/ methacrylic acid copolymer (copolymerization composition ratio (mole ratio) = 55/28.8/11.7/4.5, weight average molecular weight = 80,000) | 15.0 parts by weight |
| BPE-500 (polyfunctional acrylate manufactured by Shin Nakamura Chemical Co., Ltd.) | 7.0 parts by weight |
| F177P (fluorine-containing surface active agent manufactured by Dainippon Ink Chemical Ind. Co., Ltd.) | 0.3 part by weight |
| Methanol | 30.0 parts by weight |
| Methyl ethyl ketone | 19.0 parts by weight |
| 1-Methoxy-2-propanol | 10.0 parts by weight |

Next, the coating solution consisting of the following composition B1 was coated on the above thermoplastic resin layer and dried, whereby an intermediate layer with a dry film thickness of 1.6 μm was provided.

| Composition B1 for the intermediate layer: | |
|---|---|
| Poly(vinyl alcohol) (PVA 205 manufactured by Kuraray Co., Ltd., a saponification rate = 80%) | 130 parts by weight |
| Poly(vinyl pyrrolidone) (PVP, K-30 manufactured by GAF Corporation) | 60 parts by weight |
| Distilled water | 1,750 parts by weight |

The coating solution consisting of the following composition was coated on a temporary support having the thermoplastic resin layer and intermediate layer described above and dried, whereby a light-shielding light-sensitive resin layer having a dry film thickness of 2 μm was formed. Further, a cover sheet of polypropylene (thickness: 12 μm) was pressed on the light-shielding light-sensitive resin layer described above to thereby prepare a light-shielding light-sensitive transfer material of Example 16.

| | |
|---|---|
| Benzyl methacrylate/methacrylic acid copolymer (mole ratio = 70/30, intrinsic viscosity = 0.12) | 10.06 parts by weight |
| Dipentaerythritol hexaacrylate | 10.60 parts by weight |
| 2,4-Bis(trichloromethyl)-6-[4-(N,N'-diethoxycarbomethyl)-3-bromophenyl]-s-triazine | 0.52 part by weight |
| Pigment Red 177 | 4.00 parts by weight |
| Pigment Blue 15:6 | 2.86 parts by weight |
| Pigment Yellow 139 | 2.27 parts by weight |
| Pigment Violet 23 | 0.39 part by weight |
| Carbon black | 1.70 parts by weight |
| Hydroquinone monomethyl ether | 0.01 part by weight |
| F177P (surface active agent manufactured by Dainippon Ink Chemical Ind. Co., Ltd.) | 0.07 part by weight |
| Methyl cellosolve acetate | 40.00 parts by weight |
| Methyl ethyl ketone | 125.00 parts by weight |

The same process as described in Example 4 was repeated, except that the light-shielding light-sensitive resin layer was transferred on the color filter prepared in Example 4 to obtain the same excellent results.

The synthesis examples of Compound 1 and Compound 5 are shown below as synthesis examples of the compound represented by formula (I).

Synthesis example 1 (synthesis of Compound 1)

3-phenyl-7-[6-chloro-4-diethylamino-s-triazine-2-yl) amino]coumarin (21.1 parts) and N-butylamino-4-butanol (14.2 parts) were added to tetrahydrofuran (20 parts), and reaction was carried out for 6 hours under refluxing. The reactant was poured into water and deposited crystals were filtered off. Recrystallization was carried out from a mixed solvent of chloroform: ethyl acetate (1:1) to thereby obtain 20 parts of 3-phenyl-7-[[6-(4-hydroxybutylamino)-4-diethylamino-s-triazine-2-yl] amino]coumarin. The compound obtained has a melting point of 124° to 126° C.

Synthetic example 2 (synthesis of Compound 5)

3-phenyl-7-[6-chloro-4-diethylamino-s-triazine-2-yl)amino] coumarin (21.1 parts) and 3-hydroxymethylpiperidine (12.7 parts) were added to tetrahydrofuran (20 parts), and the reaction was carried out for 3 hours under refluxing. A reactant was poured into water and deposited crystals were filtered off. Recrystallization was carried out from ethyl acetate to thereby obtain 22.2 parts of 3-phenyl-7-[[6-(3-hydroxymethyl-piperidino)-4-diethylamino-s-triazine-2-yl] amino]coumarin. The compound obtained has a melting point of 182° to 183° C.

According to the process of the present invention, since a light-sensitive resin layer having a light-shielding property is transferred on a multicolor pattern and back face exposure can be carried out in a status that a light-shielding resin layer provided on the picture element is not substantially cured, a color filter having an excellent flatness can readily be prepared.

Example 17

The coating solution consisting of the following composition H1 was coated on a polyethylene terephthalate temporary support with a thickness of 100 μm and dried, whereby a thermoplastic resin layer with a dry film thickness of 20 μm was provided.

| Composition H1 for the thermoplastic resin layer: | |
|---|---|
| Methyl methacrylate/2-ethylhexyl acrylate/benzyl methacrylate/ methacrylic acid copolymer (copolymerization composition ratio (mole ratio) = 55/28.8/11.7/4.5, weight average molecular weight = 90,000) | 15 parts by weight |
| Polypropylene glycol diacrylate (average molecular weight = 822) | 6.5 parts by weight |
| Tetraethylene glycol dimethacrylate | 1.5 part by weight |
| p-Toluenesulfonamide | 0.5 part by weight |
| Benzophenone | 1.0 part by weight |
| Methyl ethyl ketone | 30 parts by weight |

Next, the coating solution consisting of the following composition B1 was coated on the above thermoplastic resin layer and dried, whereby a separating layer with a dry film thickness of 1.6 μm was provided.

| Composition B1 for the separating layer: | |
|---|---|
| Poly(vinyl alcohol) (PVA 205 manufactured by Kuraray Co., Ltd., a saponification rate = 80%) | 130 parts by weight |
| Poly(vinyl pyrrolidone) (PVP, K-90 manufactured by GAF Corporation) | 60 parts by weight |
| Fluorine-containing surface active agent (Surflon S-131 manufactured by | 10 parts by weight |

Composition B1 for the separating layer:

Asahi Glass Co., Ltd.)
Distilled water                                3,350 parts by weight The light-sensitive solutions for four colors, a black (for a K layer), a red (for an R layer), a green (for a G layer) and a blue (for a B layer), each having the composition shown in Table 10 were coated, respectively, on four temporary supports each having the thermoplastic resin layer and separating layer described above and dried, whereby a colored light-sensitive resin layers having a dry film thickness of 2 μm were formed.

TABLE 10

Composition of the light-sensitive layers

| | Layer | | | |
|---|---|---|---|---|
| | R | B | G | K |
| Benzyl metacrylate/metacrylic acid copolymer (mole ratio = 73/27, intrinsic viscosity = 0.12) | 60.0 | 60.0 | 60.0 | 60.0 |
| Pentaerythritol tetracrylate | 43.2 | 43.2 | 43.2 | 43.2 |
| Michler's ketone | 2.4 | 2.4 | 2.4 | 2.4 |
| 2-(o-Chlorophenyl)-4,5-diphenylimidazole dimer | 2.5 | 2.5 | 2.5 | 2.5 |
| Irgazin Red BPT (red) | 5.4 | — | — | — |
| Sudan Blue (blue) | — | 5.2 | — | — |
| Copper phthalocyanine (green) | — | — | 5.6 | — |
| Carbon black (black) | — | — | — | 5.6 |
| Methyl cellosolve acetate | 560 | 560 | 560 | 560 |
| Methyl ethyl ketone | 280 | 280 | 280 | 280 |

Further, a cover sheet of polypropylene (thickness: 12 μm) was pressed on the light-sensitive resin layers described above to prepare the red, green, blue and black light-sensitive transfer materials.

The respective light-sensitive resin layers had the light-sensitive wavelengths of 350 nm to 420 nm, and the primary light-sensitive wavelengths obtained when an ultrahigh pressure mercury lamp was used for an exposing light source, were 365 nm (i ray) and 405 nm (h ray). The respective red, green and blue picture elements had the light transmittances as shown in the following table.

TABLE 11

| | Light transmittances of the respective picture elements (%) | |
|---|---|---|
| | i ray | h ray |
| Red color | 1.0 | 1.0 |
| Green color | 0.5 | 0.8 |
| Blue color | 0.2 | 30.0 |

This light-sensitive transfer material was used to prepare a color filter by the following process. A soda glass substrate (thickness: 1.1 mm, 30 cm×40 cm) having a coat of silicon oxide with a thickness of 2,000 angstroms on the surface thereof was dipped in a 1% aqueous solution of an amino group-containing silane coupling agent (KBM603 manufactured by Shinetsu Chemical Co., Ltd.) for one minute and washed, followed by drying.

The cover sheet of the red light-sensitive transfer material was peeled off, and the face of the light-sensitive resin layer was stuck on this glass substrate by pressing (0.8 kg/cm²) and heating (130° C.) with a laminator (VP-11 manufactured by Taisei Laminator Co., Ltd.). Subsequently, the temporary support was peeled off at the interface thereof to the thermoplastic resin layer to remove the temporary support.

Next, exposing was carried out with an aligner having a 2 KW ultrahigh pressure mercury lamp via a prescribed photomask (size of a picture element: 40 μm×200 μm) at an exposure of 50 mj/cm², and a spray development was carried out with a 1:10 mixed aqueous solution of CD (trade name of a developing solution manufactured by Fuji Hunt Electronics Technology Co., Ltd.) and water to remove an unnecessary part, whereby a red picture element pattern was formed on the glass substrate.

Next, a green light-sensitive transfer material was stuck in the same manner as that described above on the glass substrate on which the red picture element pattern was formed and was subjected to peeling, exposing through the mask and developing, whereby a green picture element pattern was formed.

The same process was repeated with the blue and black light-sensitive transfer materials to prepare a color filter on the transparent glass substrate, except that a black matrix was used in exposing the black light-sensitive transfer material.

The color filter obtained having a black matrix had no picture element and provided good adhesion to the substrate.

When 100 sheets of the color filters were prepared in the same manner, three sheets had one deficiency at each of the picture elements of red, green, blue and black matrixes.

The light-sensitive resin layer of the light-sensitive transfer material having a size of 3 cm×10 cm and the same color as the deficient part was put on a color filter layer at a region including the above deficient part and was stuck to each deficient part with the laminator described above. The temporary support was peeled off and exposing was carried out from a back face of the substrate without passing through a mask.

In this case, however, since a transmittance of the h ray in the blue picture element exceeded 2% as shown in Table 11, a Toshiba glass filter UVD36c was placed between a ultrahigh pressure mercury lamp light source and the substrate, and an exposure of 100 mj/cm² was given, followed by developing.

It was confirmed that the respective picture elements of red, green, blue and black matrixes were formed at the deficient parts of the picture elements and that filter characteristics such as transmittance and haze, flatness and adhesiveness were substantially the same as those of an original picture element at a non-deficient part and a satisfactory correction could be made.

Example 18

The light-sensitive transfer sheets of the respective colors were prepared in the same manner as described in Example 17, except that the composition of Table 10 in Example 17 was replaced with the composition of the following Table 12. The respective picture elements of the light-sensitive transfer sheet prepared had the light transmittances as shown in Table 13.

TABLE 12

Composition of the light-sensitive layers

| | Layer | | | |
|---|---|---|---|---|
| | R | B | G | K |
| Benzyl metacrylate/metacrylic acid copolymer (mole ratio = 73/27, intrinsic viscosity = 0.12) | 60.0 | 60.0 | 60.0 | 60.0 |
| Pentaerythritol tetracrylate | 43.2 | 43.2 | 43.2 | 43.2 |
| 2-(p-Methoxyphenyl)-4,6-bis(trichloromethyl)-s-triazine | 2.0 | 2.0 | 2.0 | 2.0 |
| Irgazin Red BPT | 5.4 | — | — | — |
| Sudan Blue | — | 5.2 | — | — |
| Copper phthalocyanine | — | — | 5.6 | — |
| Carbon black | — | — | — | 5.6 |
| Zinc oxide | 2.0 | 2.0 | — | — |
| Methyl cellosolve acetate | 560 | 560 | 560 | 560 |
| Methyl ethyl ketone | 280 | 280 | 280 | 280 |

TABLE 13

Light transmittances of the respective picture elements (%)

| | i ray | h ray |
|---|---|---|
| Red color | 0.1 | 0.1 |
| Green color | 0.1 | 0.1 |
| Blue color | 0.2 | 30.0 |

The deficient parts generated were corrected in the same manner as described in Example 17 to obtain the same good results as those in Example 17.

Comparative Example 5

The deficient parts were corrected in the same manner as that in Example 17, except that the Toshiba glass filter (UVD36c) was not used in exposing, to find that the light-sensitive resin layers of the respective colors used for correction remained on the blue picture element, and the color filter prepared was difficult to use.

Comparative Example 6

Light-sensitive transfer sheets of the respective colors were prepared in the same manner as described in Example 17, except that the composition of Table 12 in Example 18 was replaced with the composition of the following Table 14 (composition from which zinc oxide was removed). The respective picture elements of the light-sensitive transfer sheet prepared had the light transmittances as shown in Table 15.

TABLE 14

Composition of the light-sensitive layers

| | Layer | | | |
|---|---|---|---|---|
| | R | B | G | K |
| Benzyl metacrylate/metacrylic acid copolymer (mole ratio = 73/27, intrinsic viscosity = 0.12) | 60.0 | 60.0 | 60.0 | 60.0 |
| Pentaerythritol tetracrylate | 43.2 | 43.2 | 43.2 | 43.2 |
| 2-(p-Methoxyphenyl)-4,6-bis(trichloromethyl)-s-triazine | 2.0 | 2.0 | 2.0 | 2.0 |
| Irgazin Red BPT | 5.4 | — | — | — |
| Sudan Blue | — | 5.2 | — | — |
| Copper phthalocyanine | — | — | 5.6 | — |
| Carbon black | — | — | — | 5.6 |
| Methyl cellosolve acetate | 560 | 560 | 560 | 560 |
| Methyl ethyl ketone | 280 | 280 | 280 | 280 |

TABLE 15

Light transmittances of the respective picture elements (%)

| | i ray | h ray |
|---|---|---|
| Red color | 4.1 | 0.1 |
| Green color | 0.1 | 0.1 |
| Blue color | 0.2 | 30.0 |

The deficient parts generated were corrected in the same manner as described in Example 17, and exposing was carried out at the same exposure as that in Example 17. However, since an i ray transmittance of the red picture element exceeded 2%, development inferiority occurred on the red color picture element. Further, when exposing was carried out at a half exposure, development inferiority did not occur on the red color picture element. However, a corrected part was not sufficiently cured because of little exposure and difference in level generated at a space to a non-deficient part.

Example 19

Light-sensitive transfer sheets of the respective colors were prepared in the same manner as described in Example 17, except that the composition of Table 10 in Example 17 was replaced with the composition of the following Table 16. The respective picture elements of the light-sensitive transfer sheet prepared had the light transmittances as shown in Table 17.

TABLE 16

Composition of the light-sensitive layers

| | Layer | | | |
|---|---|---|---|---|
| | R | B | G | K |
| Benzyl metacrylate/metacrylic acid copolymer (mole ratio = 73/27, intrinsic viscosity = 0.12) | 60.0 | 60.0 | 60.0 | 60.0 |
| Pentaerythritol tetracrylate | 43.2 | 43.2 | 43.2 | 43.2 |
| 2-(p-Methoxyphenyl)-4,6-bis(trichloromethyl)-s-triazine | 2.0 | 2.0 | 2.0 | 2.0 |
| Irgazin Red BPT | 5.4 | — | — | — |
| Sudan Blue | — | 5.2 | — | — |
| Copper phthalocyanine | — | — | 5.6 | — |
| Carbon black | — | — | — | 5.6 |
| 7-((4-Chloro-6-(diethylamino)-s-triazine-2-yl)amino)-3-phenylcoumarin | 10.0 | 10.0 | 10.0 | — |
| Methyl cellosolve acetate | 560 | 560 | 560 | 560 |
| Methyl ethyl ketone | 280 | 280 | 280 | 280 |

TABLE 17

| | Light transmittances of the respective picture elements (%) | |
|---|---|---|
| | i ray | h ray |
| Red color | 0.2 | 0.7 |
| Green color | 0.2 | 0.8 |
| Blue color | 0.2 | 30.0 |

This light-sensitive transfer material was used to prepare a color filter by the following process. A soda glass substrate (thickness: 1.1 mm, 30 cm×40 cm) having a coat of silicon oxide with a thickness of 2000 angstroms on the surface thereof was dipped in a 1% aqueous solution of an amino group-containing silane coupling agent (KBM603 manufactured by Shinetsu Chemical Co., Ltd.) for one minute and washed, followed by drying.

A cover sheet of the red light-sensitive transfer material was peeled off, and the face of the light-sensitive resin layer was stuck on this glass substrate by pressing (0.8 kg/cm$^2$) and heating (130° C.) with a laminator (VP-11 manufactured by Taisei Laminator Co., Ltd.). Subsequently, a temporary support was peeled off at the interface thereof to a thermoplastic resin layer to remove the temporary support.

Next, exposing was carried out with an aligner having a 2 KW ultrahigh pressure mercury lamp via a prescribed photomask (size of a picture element: 40 μm×200 μm) at an exposure of 50 mj/cm$^2$, and a spray development was carried out with a 1:10 mixed aqueous solution of CD (brand name of a developing solution manufactured by Fuji Hunt Electronics Technology Co., Ltd.) and water to remove an unnecessary part, whereby a red picture element pattern was formed on the glass substrate.

Next, the green light-sensitive transfer material was stuck in the same manner as that described above on the glass substrate on which the red picture element pattern was formed and was subjected to peeling, exposing through a mask and developing, whereby a green picture element pattern was formed.

The same process was repeated with the blue and black light-sensitive transfer materials to prepare a color filter on a transparent glass substrate, except that a black matrix was used in exposing the black light-sensitive transfer material.

The color filter obtained having a black matrix had no dropping of a picture element and provided good adhesiveness to the substrate. The respective transmittances of an i ray and an h ray in the respective red, green and blue picture elements were as shown in Table 18.

TABLE 18

| | Light transmittances of the respective picture elements (%) | |
|---|---|---|
| | i ray | h ray |
| Red color | 0.4 | 0.7 |
| Green color | 0.4 | 0.8 |
| Blue color | 0.4 | 30.0 |

When 100 sheets of the color filters were prepared in the same manner, three sheets had one deficiency at each of the respective picture elements of red, green, blue and black matrixes.

The light-sensitive resin layer of the light-sensitive transfer material having a size of 3 cm×10 cm and the same color as the deficient part was put on the color filter layer at a region including the above deficient part and was stuck to each deficient part with the laminator described above. The temporary support was peeled off and exposing was carried out from the back face of the substrate without passing through a mask.

In this case, however, since the transmittance of the h ray in the blue picture element exceeded 2% as shown in Table 18, the Toshiba glass filter UVD36c was placed between an ultrahigh pressure mercury lamp light source and the substrate, and an exposure of 100 mj/cm$^2$ was given, followed by developing.

It was confirmed that the respective picture elements of red, green, blue and black matrixes were formed at the deficient parts of the picture elements and that filter characteristics such as transmittance and haze, flatness and adhesiveness were substantially the same as those of an original picture element at a non-deficient part and a satisfactory correction could be made.

Example 20

To the solutions for the colored light-sensitive layers having the composition shown in Table 10 of Example 17 was added 7-{{4-chloro-6-(diethylamino)-s-triazine-2-yl}amino}-3-phenylcoumarin so that its solid matter content became 8%. The mixtures were used to form a color filter consisting of the R, G and B picture elements on a glass substrate (thickness: 1.1 mm) in the same manner as described in Example 17. In this case, a heat treatment was effected for each of R, G and B colors at 220° C. for 20 minutes to completely cure the respective picture elements. The transmittances of an i ray and an h ray in the respective picture elements obtained were as shown in Table 19.

TABLE 19

| | Light transmittances of the respective picture elements (%) | |
|---|---|---|
| | i ray | h ray |
| Red color | 0.5 | 1.0 |
| Green color | 0.5 | 0.8 |
| Blue color | 0.2 | 30.0 |

Evaluation was carried out in the same manner as described in Example 17 and the same good results were obtained.

Example 21

The same procedure as described in Example 20 was carried out, except that 7-{{4-methoxy-6-(diethylamino)-s-triazine-2-yl} -3-phenylcoumarin} was used in place of 7-{{4-chloro- 6-(diethylamino)-s-triazine-2-yl}amino}-3-phenylcoumarin}. The transmittances of the respective picture elements were as shown in Table 20.

TABLE 20

| | Light transmittances of the respective picture elements (%) | |
|---|---|---|
| | i ray | h ray |
| Red color | 0.5 | 1.0 |
| Green color | 0.5 | 0.8 |
| Blue color | 0.2 | 30.0 |

Evaluation was carried out in the same manner as described in Example 17 and the same results as those obtained in Example 20 were obtained.

Since the method for correcting a deficiency of a color filter by a transfer process and a back face exposing process according to the present invention makes possible readily correcting the deficiency by a simple procedure and provides excellent flatness and a high quality picture element after correction, the present inventive process can improve field in preparing a color filter to a large extent.

Example 21

The coating solution consisting of the following composition H1 was coated and dried on a polyethylene terephthalate temporary support having a thickness of 100 μm, whereby a thermoplastic resin layer with a dry thickness of 20 μm was provided.

| Composition H1 for the thermoplastic resin layer: | |
|---|---|
| Methyl methacrykate/2-ethylhexyl acrylate/benzyl methacrylate/methacrylic acid copolymer (copolymerization composition ratio (mole ratio) = 55/28.8/11.7/4.5, weight average molecular weight = 80,000) | 15.0 parts by weight |
| BPE-500 (Polyfunctional acrylate manufactured by Shin Nakamura Chemical Co., Ltd.) | 7.0 parts by weight |
| F177P (Fluorine-containing surface active agent manufactured by Dainippon Ink Chemical Co., Ltd.) | 0.3 part by weight |
| Methanol | 30.0 parts by weight |
| Methyl ethyl ketone | 19.0 parts by weight |
| 1-Methoxy-2-propanol | 10.0 parts by weight |

Next, the coating solution consisting of the following composition B1 was coated and dried on the above thermoplastic resin layer, whereby an intermediate layer with a dry thickness of 1.6 μm was provided.

| Composition B1 for the separating layer: | |
|---|---|
| Poly(vinyl alcohol) (PVA 205 manufactured by Kuraray Co., Ltd., a saponification rate = 80%) | 130 parts by weight |
| Poly(vinyl pyrrolidone) (PVP, K-30 manufactured by GAF Corporation | 60 parts by weight |
| Distilled water | 2,110 parts by weight |
| Methanol | 1,750 parts by weight |

The coating solutions having the compositions shown in the following Table 21 each was coated and dried on a temporary support having the above thermoplastic resin layer and the above intermediate layer, whereby a light-shielding light-sensitive resin layer with a dry thickness of 2 μm was formed. Further, a cover sheet (thickness: 12 μm) of polypropylene was pressed on the above light-shielding light-sensitive resin layer to prepare each of the light-shielding light-sensitive transfer materials of Examples 21 to 28.

TABLE 21

| | Example | | | | | | | |
|---|---|---|---|---|---|---|---|---|
| | 21 | 22 | 23 | 24 | 25 | 26 | 27 | 28 |
| Benzyl methacrylate/methacrylic acid copolymer (mole ratio = 70/30, limiting viscosity = 0.12) | 10.06 | 7.52 | 4.41 | 4.39 | 5.87 | 4.27 | 4.31 | 34.31 |
| Dipentaerythritol hexaacrylate | 10.60 | 6.90 | 4.63 | 4.63 | 6.20 | 4.50 | 4.52 | 36.14 |
| 2,4-Bis(trichloromethyl)-6-[4-(N,N-diethoxycarbomethyl)-3-bromophenyl]-s-triazine | 0.52 | 0.34 | 0.23 | 0.23 | 0.31 | 0.22 | 0.22 | 1.78 |
| Pigment Red 177 | 4.00 | 4.00 | 2.34 | 2.66 | 2.66 | 2.84 | 2.70 | 0.00 |
| Pigment Blue 15:6 | 2.86 | 2.86 | 1.67 | 1.66 | 1.66 | 1.71 | 1.80 | 6.02 |
| Pigment Yellow 139 | 2.27 | 2.27 | 1.33 | 0.99 | 0.99 | 1.13 | 1.21 | 4.51 |
| Pigment Violet 23 | 0.39 | 0.39 | 0.23 | 0.00 | 0.00 | 0.00 | 0.00 | 3.72 |
| Carbon Black | 1.70 | 0.00 | 0.00 | 0.27 | 1.26 | 0.00 | 0.00 | 13.29 |
| Hydroquinone monomethyl ether | 0.01 | 0.01 | 0.01 | 0.01 | 0.01 | 0.01 | 0.01 | 0.02 |
| F177P (Surface active agent manufactured by Dainippon Ink Chemical Co., Ltd. | 0.07 | 0.07 | 0.03 | 0.03 | 0.03 | 0.03 | 0.03 | 0.23 |
| Methyl cellosolve acetate | 40.00 | 40.00 | 18.00 | 18.00 | 20.00 | 15.00 | 15.00 | 40.0 |
| Methyl ethyl ketone | 125.0 | 125.0 | 60.0 | 60.0 | 70.0 | 55.0 | 55.0 | 60.0 |
| Δx | 0.08 | 0.05 | 0.09 | 0.08 | 0.09 | 0.08 | 0.09 | 0.04 |
| Δy | 0.07 | 0.07 | 0.08 | 0.06 | 0.08 | 0.08 | 0.07 | 0.05 |
| Y value | 0.7 | 1.0 | 0.9 | 0.8 | 0.8 | 1.2 | 1.3 | 0.35 |
| Y value; 365 nm | 2.3:1 | 2.0:1 | 2.2:1 | 2.4:1 | 2.6:1 | 2.2:1 | 2.3:1 | 10:1 |

The Y value is a value obtained when an F10 light source was used.

There was prepared a color filter having a layer thickness of 2 μm and the R, G and B picture elements of the compositions shown in the following Table 22 on a glass substrate (thickness: 1.1 mm)

TABLE 22

| Composition of the Light-sensitive layers | | | |
|---|---|---|---|
| | Layer | | |
| | R | B | G |
| Benzyl metacrylate/metacrylic acid copolymer (mole ratio = 73/27, intrinsic viscosity = 0.12) | 60.0 | 60.0 | 60.0 |
| Pentaerythritol tetracrylate | 43.2 | 43.2 | 43.2 |
| Michler's ketone | 2.0 | 2.0 | 2.0 |
| 2-(o-Chlorophenyl)-diphenylimidazole dimer | 2.5 | 2.5 | 2.5 |
| Irgazin Red BPT (red) | 5.4 | — | — |
| Sudan Blue (blue) | — | 5.2 | — |
| Copper phthalocyanine (green) | — | — | 5.6 |
| Carbon black (black) | — | — | — |
| Methyl cellosolve acetate | 560 | 560 | 560 |
| Methyl ethyl ketone | 280 | 280 | 280 |

The cover sheets of the light-shielding light-sensitive transfer materials in Examples 21 to 28 were peeled off and the light-shielding light-sensitive resin faces thereof were pressed on the R, G, and B filter, respectively, by applying a pressure (0.8 kg/cm²) and heating (130° C.) with a laminator (VP-11 manufactured by Taisei Laminator Co., Ltd.) to stick them, followed by peeling off the temporary supports from the thermoplastic resin layers at the interfaces thereof and removing the temporary supports, respectively.

Next, a back exposure was applied from the side opposite to the color filter face with an ultrahigh mercury lamp in Examples 21 to 28, wherein a Toshiba glass filter was placed between the light source and the sample to cut off a wavelength of 400 μm or more. The exposure was 100 mj/cm². Thereafter, the exposed samples were developed in a 1% sodium carbonate solution to remove an unnecessary portion, whereby the light-shielding layers were formed at the spaces between the respective R, G, and B picture elements. The finished color filters had no overlappings of the light-shielding layers with the R, G and B layers and had the light-shielding layers having the high optical densities with the Y values shown in Table 21. Flatness also was as good as ±0.1 μm in every case.

Comparative Example 7

The procedure of Example 21 was repeated, except that the coating solution having the following composition C1 was coated and dried to form a light-shielding resin layer having a dry layer thickness of 2 μm.

| Composition C1: | |
| --- | --- |
| Benzyl metacrylate/metacrylic acid copolymer (mole ratio = 70/30, intrinsic viscosity = 0.12) | 11.00 parts by weight |
| Dipentaerythritol hexaacrylate | 10.60 parts by weight |
| 2,4-Bis(trichloromethyl)-6-[4-(N,N-diethyoxycarbomethyl)-3-bromophenyl]-s-triazine | 0.52 part by weight |
| Carbon black | 1.70 parts by weight |
| Hydroquinone monomethyl ether | 0.01 part by weight |
| F177P (surface active agent manufactured by Dainippon Ink Chemical Co., Ltd.) | 0.07 part by weight |
| Methyl cellosolve acetate | 40.00 parts by weight |
| Methyl ethyl ketone | 125.00 parts by weight |

The Y value of the light-shielding light-sensitive resin layer thus obtained was 0.7 when the light source was an F10 light source. The transmittance in 365 nm was 0.02% and the ratio of the Y value to the transmittance in 365 nm was 35 :1. The absolute values of the differences of the x and y values for the achromatic color point were 0.03 and 0.04, respectively.

While the color filter finally obtained had no overlappings of the light-shielding layer with the R, G and B layers, the light-shielding layer was not photo-cured to the depth of the film. Accordingly, the Y value of the light-shielding layer obtained was 5 and an optical density was insufficient.

Comparative Example 8

The procedure described in Example 21 was repeated, except that the coating solution having the following composition C2 was coated and dried to form a light-shielding resin layer having a dry layer thickness of 2 μm.

| Composition C2: | |
| --- | --- |
| Benzyl metacrylate/metacrylic acid copolymer (mole ratio = 70/30, intrinsic viscosity = 0.12) | 11.00 parts by weight |
| Dipentaerythritol hexaacrylate | 10.60 parts by weight |
| 2,4-Bis(trichloromethyl)-6-[4-(N,N-diethyoxycarbomethyl)-3-bromophenyl]-s-triazine | 0.52 part by weight |
| Pigment Red 177 | 4.00 parts by weight |
| Pigment Blue 15:6 | 2.86 parts by weight |
| Hydroquinone monomethyl ether | 0.01 part by weight |
| F177P (surface active agent manufactured by Dainippon Ink Chemical Co., Ltd.) | 0.07 part by weight |
| Methyl cellosolve acetate | 40.00 parts by weight |
| Methyl ethyl ketone | 125.00 parts by weight |

The Y value of the light-shielding light-sensitive resin layer thus obtained was 0.7 when the light source was an F10 light source. The transmittance in 365 nm was 0.02% and the ratio of the Y value to the transmittance in 365 nm was 35 :1. The absolute values of the differences of the x and y values from the achromatic color point were 0.04 and 0.03, respectively.

While the color filter finally obtained had no overlappings of the light-shielding layer with the R, G and B layers, the light-shielding layer was not photo-cured to the depth of the film. Accordingly, the Y value of the light-shielding layer obtained was 5 and an optical density was insufficient.

Comparative Example 9

The procedure of Example 21 was repeated except that the coating solution having the following composition C3 was coated and dried to form a light-shielding resin layer having a dry layer thickness of 2 μm.

| Composition C3: | |
| --- | --- |
| Benzyl metacrylate/metacrylic acid copolymer (mole ratio = 70/30, intrinsic viscosity = 0.12) | 11.00 parts by weight |
| Dipentaerythritol hexaacrylate | 10.60 parts by weight |
| 2,4-Bis(trichloromethyl)-6-[4-(N,N-diethyoxycarbomethyl)-3-bromophenyl]-s-triazine | 0.52 part by weight |
| Pigment Yellow 139 | 2.27 parts by weight |
| Pigment Violet 23 | 0.39 parts by weight |
| Carbon black | 1.70 parts by weight |
| Hydroquinone monomethyl ether | 0.01 part by weight |
| F177P (surface active agent manufactured by Dainippon Ink Chemical Co., Ltd.) | 0.07 part by weight |
| Methyl cellosolve acetate | 40.00 parts by weight |
| Methyl ethyl ketone | 125.00 parts by weight |

The Y value of the light-shielding light-sensitive resin layer thus obtained was 5.0 when the light source was an F10 light source. The transmittance in 365 nm was 1.0% and the ratio of the Y value to the transmittance in 365 nm was 5 :1. The absolute values of the differences of the x and y values from the achromatic color point were 0.04 and 0.03, respectively.

While the color filter finally obtained had no overlappings of the light-shielding layer with the R, G and B layers and the light-shielding layer was photo-cured to the surface thereof, the Y value of the light-shielding layer obtained was 5 and an optical density was insufficient.

The light-shielding light-sensitive composition containing at least two kinds of coloring agents of the present invention can provide a light-shielding images which have an excellent light-shielding property and no deficiencies such as white peppers, in a simple process such as back face exposure (self-alignment).

What is claimed is:

1. A light-shielding light-sensitive resin composition containing at least (1) an alkali soluble binder, (2) a photopolymerization initiator, (3) an addition-polymerizable monomer having an ethylenically unsaturated double bond, and (4) at least two coloring agents, wherein the light-shielding light-sensitive resin composition is characterized in that said resin composition is equivalent or close to a black color in terms of a hue and, when formed into a light-shielding light-sensitive resin layer having a layer thickness of 1 to 3 μm, has a transmittability in a visible ray region of 2 or less and a ratio of the transmittability in the visible region to the transmittability in a UV region of 1:1 to 20:1.

2. The light-shielding light-sensitive resin composition of claim 1, wherein said at least two coloring agents is each a coloring pigment.

3. The light-shielding light-sensitive resin composition of claim 2, wherein the coloring agents consist essentially of (1) a mixture of a red pigment and a blue pigment which are in a complementary color relationship to each other and (2) a mixture of a yellow pigment and a purple pigment which are in the complementary color relationship to each other.

4. The light-shielding light-sensitive resin composition of claim 3, wherein the coloring agents further comprise a black pigment.

5. The light-shielding light-sensitive resin composition of claim 2, wherein the coloring agents comprise (1) a mixture of a yellow pigment and a purple pigment which are in a complementary color relationship to each other and (2) a blue pigment.

6. The light-shielding light-sensitive resin composition described of claim 5, wherein the coloring agents further comprise a black pigment.

* * * * *